US011468932B2

(12) United States Patent
Endoh et al.

(10) Patent No.: US 11,468,932 B2
(45) Date of Patent: Oct. 11, 2022

(54) MAGNETIC MEMORY DEVICE WITH WRITE CURRENT FLOWING SIMULTANEOUSLY THROUGH NON-ADJACENT LINES IN MEMORY CELL ARRAY

(71) Applicant: TOHOKU UNIVERSITY, Miyagi (JP)

(72) Inventors: Tetsuo Endoh, Miyagi (JP); Yoshiaki Saito, Miyagi (JP); Shoji Ikeda, Miyagi (JP)

(73) Assignee: TOHOKU UNIVERSITY, Miyagi (JP)

( * ) Notice: Subject to any disclaimer, the term of this patent is extended or adjusted under 35 U.S.C. 154(b) by 0 days.

(21) Appl. No.: 17/254,592

(22) PCT Filed: Jun. 20, 2019

(86) PCT No.: PCT/JP2019/024596
§ 371 (c)(1),
(2) Date: Dec. 21, 2020

(87) PCT Pub. No.: WO2019/244998
PCT Pub. Date: Dec. 26, 2019

(65) Prior Publication Data
US 2021/0125654 A1   Apr. 29, 2021

(30) Foreign Application Priority Data

Jun. 21, 2018   (JP) .............................. JP2018-117935

(51) Int. Cl.
*G11C 11/16*   (2006.01)
(52) U.S. Cl.
CPC ........ *G11C 11/1675* (2013.01); *G11C 11/161* (2013.01); *G11C 11/1655* (2013.01); *G11C 11/1657* (2013.01)
(58) Field of Classification Search
None
See application file for complete search history.

(56) References Cited

U.S. PATENT DOCUMENTS

| 2010/0097841 | A1* | 4/2010 | Lu | G11C 13/0069 |
| | | | | 365/148 |
| 2011/0292714 | A1* | 12/2011 | Andre | G11C 11/161 |
| | | | | 365/148 |
| 2014/0112055 | A1* | 4/2014 | Kawahara | G11C 13/0023 |
| | | | | 365/148 |

FOREIGN PATENT DOCUMENTS

| JP | 2013077339 A | 4/2013 |
| JP | 2013200930 A | 10/2013 |
| JP | 2017112351 A | 6/2017 |

OTHER PUBLICATIONS

H. Yang et al., "Threshold switching selector and 1S1R integration development for 3D cross-point STT-MRAM," 2017 IEEE International Electron Devices Meeting (IEDM), San Francisco, CA, 2017, pp. 38.1.1-38.1.4, doi: 10.1109/IEDM.2017.8268513.

* cited by examiner

*Primary Examiner* — J. H. Hur
(74) *Attorney, Agent, or Firm* — Fox Rothschild LLP; Robert. J. Sacco; Carol E. Thorstad-Forsyth

(57) ABSTRACT

A magnetic memory device includes: a memory cell array including a plurality of lines arranged parallel to one another at predetermined intervals and extending in one direction, and a plurality of memory cells connected to the plurality of lines and arranged in a matrix along an extending direction of the plurality of lines and along an arrangement direction of the plurality of lines, each of the plurality of memory cells including a magnetoresistance effect element; a selection circuit connected to the plurality of lines and configured to select non-adjacent lines that are not adjacent to one another, from the plurality of lines; and a controller connected to the (Continued)

selection circuit and configured to cause the selection circuit to select the non-adjacent lines and allow a write current to flow through the non-adjacent lines simultaneously in writing data on the memory cell array.

10 Claims, 26 Drawing Sheets

MAGNETIC MEMORY DEVICE WITH WRITE CURRENT FLOWING SIMULTANEOUSLY THROUGH NON-ADJACENT LINES IN MEMORY CELL ARRAY

CROSS REFERENCE TO RELATED APPLICATIONS

This application is a § 371 U.S. National Phase Entry of International Patent Application No. PCT/JP2019/024596, filed on Jun. 20, 2019, which claims priority to and the benefit of Japanese Patent Application No. 2018-117935, filed on Jun. 21, 2018, the entireties of which are hereby incorporated herein by reference.

TECHNICAL FIELD

The present invention relates to a magnetic memory device.

BACKGROUND ART

Magnetic memory devices using magnetoresistive effect elements as memory elements have been known as next-generation nonvolatile memory devices which achieve high-speed properties and high writing endurance. Spin transfer torque magnetic random access memories (STT-MRAMs) and spin-orbit torque magnetic random access memories (SOT-MRAMs) have attracted much attention as nonvolatile memories used for the magnetic memory devices. In STT-MRAM, a write current flowing through a magnetic tunnel junction (MTJ) element of a memory cell generates spin transfer torque, which causes reversal of magnetization in a recording layer of the MTJ element. In SOT-MRAM, an MTJ element is provided on a heavy metal layer, and a write current flowing through the heavy metal layer induces a spin current by spin-orbit interaction, and the spin current is absorbed into a recording layer of the MTJ element, which causes reversal of magnetization.

In recent years, various techniques have been studied to attain higher-capacity magnetic memory devices. For example, a cross-point magnetic memory device has been proposed in which a memory cell is located at an intersection point between a word line and a bit line (See Non-Patent Literature 1). In addition, a magnetic memory device has been proposed in which MTJ elements are closely arranged in series on a heavy metal layer having an elongate shape extending in one direction (See Patent Literature 1).

CITATION LIST

Patent Literature

Patent Literature 1: Japanese Patent Application Laid-Open Publication No. 2017-112351

Non-Patent Literature

Non-Patent Literature 1: H. Yang, X. Hao, Z. Wang, R. Malmhall, H. Gan, K. Satoh, J. Zhang, D. H. Jung, X. Wang, Y. Zhou, B. K. Yen and Y. Huai, "Threshold Switching Selector and 1S1R Integration Development for 3D Cross-point STT-MRAM," IEDM 2017 Digest, 38.1.1-38.1.4

SUMMARY OF THE INVENTION

Technical Problem

If the memory cells are closely arranged in order to attain a 1Xnm-generation high-capacity magnetic memory device, crosstalk may occur between the adjacent memory cells due to the write current. Hereinafter, the influence of the write current will be described with reference to FIG. 1 to FIG. 4A and FIG. 4B. FIG. 1 is a schematic plan view of a memory cell array 1 of a cross-point magnetic memory device using STT-MRAM. In the memory cell array 1, memory cells 2 each having an MTJ element and a selector are located at intersection points between bit lines BL and word lines WL.

As shown in FIG. 1, in the memory cell array 1, focusing on a certain MTJ element, there is a moment when write current Iw1, Iw2, Iw3, Iw4, and Iw5 simultaneously flows at the time of writing data. The current flowing through the bit line BL generates a current magnetic field. For example, focusing on a memory cell c2, the write current Iw1 flows in +y direction through the bit line BL of a memory cell c1 on the left side, and the write current Iw3 flows in +y direction through the bit line BL of a memory cell c3 on the right side. Accordingly, as shown in FIG. 2A, in the memory cell c2, magnetic fields in +x direction are intensified, whereas a magnetic field in +z direction and a magnetic field in −z direction are almost cancelled out. Focusing on a memory cell c5, the write current Iw3 flows in +y direction through the bit line BL of a memory cell c4 on the left side, and the write current Iw5 flows in −y direction through the bit line BL of a memory cell c6 on the right side. Accordingly, as shown in FIG. 2B, in the memory cell c5, the magnetic field in +x direction and a magnetic field in −x direction are almost cancelled out, whereas the magnetic fields in −z direction are intensified.

In FIG. 3, a relationship between a distance (nm) between the adjacent memory cells and a current magnetic field (Oe) generated from the adjacent memory cell is shown. As shown in FIG. 3, the magnitude of the current magnetic field can be estimated by Biot-Savart law, and as the distance between the adjacent memory cells decreases, the current magnetic field generated from the adjacent memory cell increases. For example, in a case where current density is $2.4 * 10^6$ A/cm$^2$ and the distance between the adjacent memory cells is 10 nm, a current magnetic field of about 0.6 Oe is generated from the adjacent memory cell on one side. When the current magnetic fields generated from the memory cells on both sides are intensified, a current magnetic field of about 1.2 Oe is applied. On the other hand, when the current magnetic fields generated from the memory cells on both sides are cancelled out, the current magnetic field is not applied. Accordingly, a stray magnetic field varies in the maximum range of 0.0 Oe to 1.2 Oe.

The stray magnetic field affects a write error rate (WER). FIG. 4A and FIG. 4B indicate an influence of the stray magnetic field $H_{stray}$ generated from the write current I (a pulse current) on the write error rate. As shown in a graph of FIG. 4A, as an external magnetic field $H_{ext}$ and the write current I are increased, the write error rate can be decreased. Although the write error rate can be decreased as the write current I is increased, the stray magnetic field $H_{stray}$ is generated from the write current I. As shown in a left graph (an enlarged view) of FIG. 4B, even the stray magnetic field $H_{stray}$ of 5 Oe or less is found to have a negative effect on the write error rate.

The invention has been made in view of the foregoing, and an object of the invention is to provide a magnetic memory device capable of reducing the influence of a magnetic field generated from a write current.

Solution to Problem

A magnetic memory device according to the invention includes: a memory cell array including a plurality of lines arranged parallel to one another at predetermined intervals and extending in one direction, and a plurality of memory cells connected to the plurality of lines and arranged in a matrix along an extending direction of the plurality of lines and along an arrangement direction of the plurality of lines, each of the plurality of memory cells including a magnetoresistance effect element; a selection circuit connected to the plurality of lines and configured to select non-adjacent lines that are not adjacent to one another, from the plurality of lines; and a controller connected to the selection circuit and configured to cause the selection circuit to select the non-adjacent lines and allow a write current to flow through the non-adjacent lines simultaneously in writing data on the memory cell array.

Advantageous Effects of the Invention

According to the invention, since a write current simultaneously flows through non-adjacent lines of a plurality of lines of a memory cell array, the influence of a magnetic field due to the write current can be reduced between adjacent memory cells, and the occurrence of crosstalk can be suppressed.

DESCRIPTION OF EMBODIMENTS

Hereinafter, embodiments of the invention will be described with reference to the drawings. The same reference signs are used to designate the same or similar components throughout the drawings. The drawings are schematic, and a relationship between a plane dimension and a thickness and a thickness ratio of each member are different from the actual ones. It is apparent that each of the drawings includes portions having different dimensional relationships or ratios from each other.

First Embodiment

Figure 1:
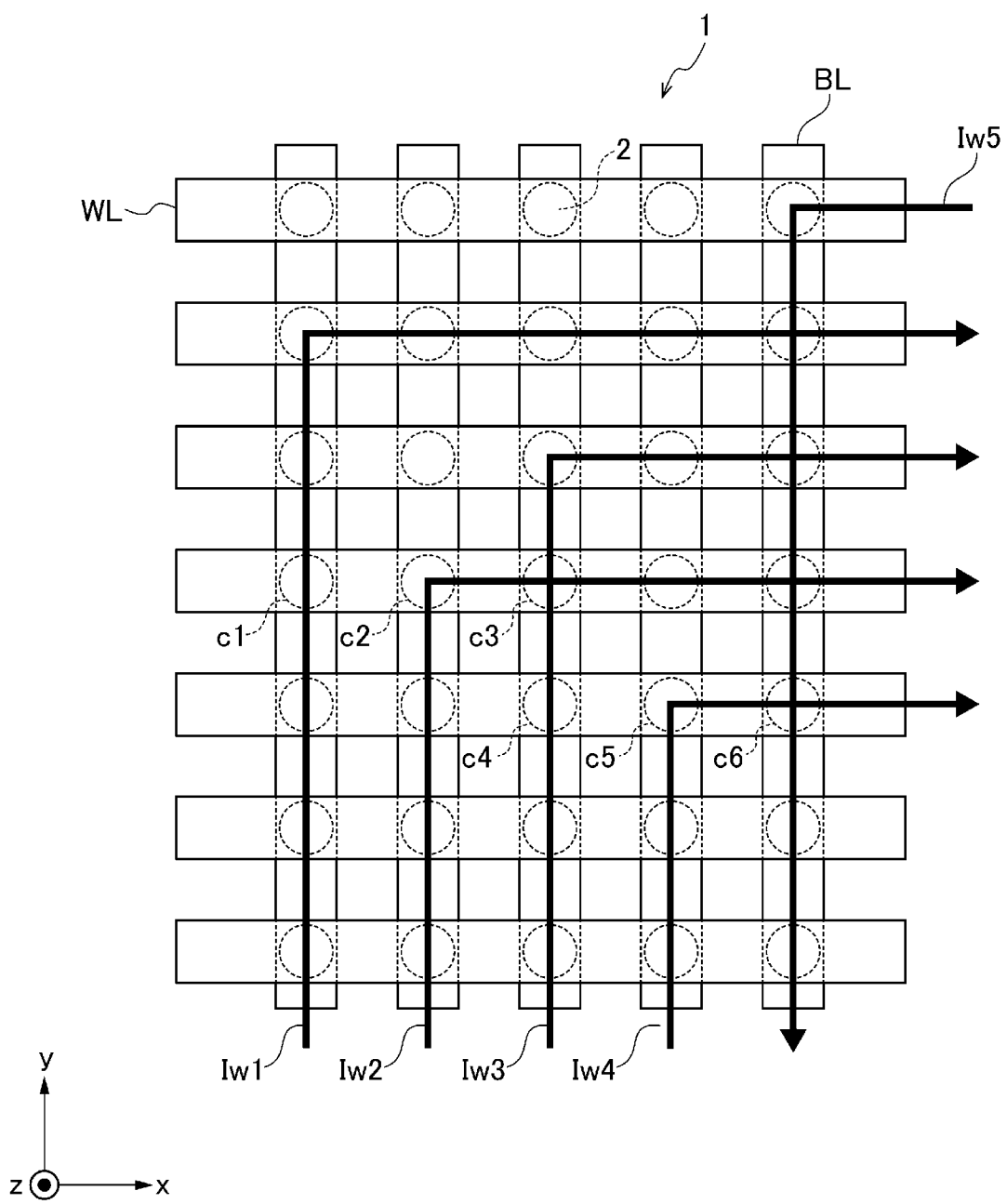
FIG. 1 is a schematic plan view of a cross-point memory cell array in which a write current flows.
Figure 2A:
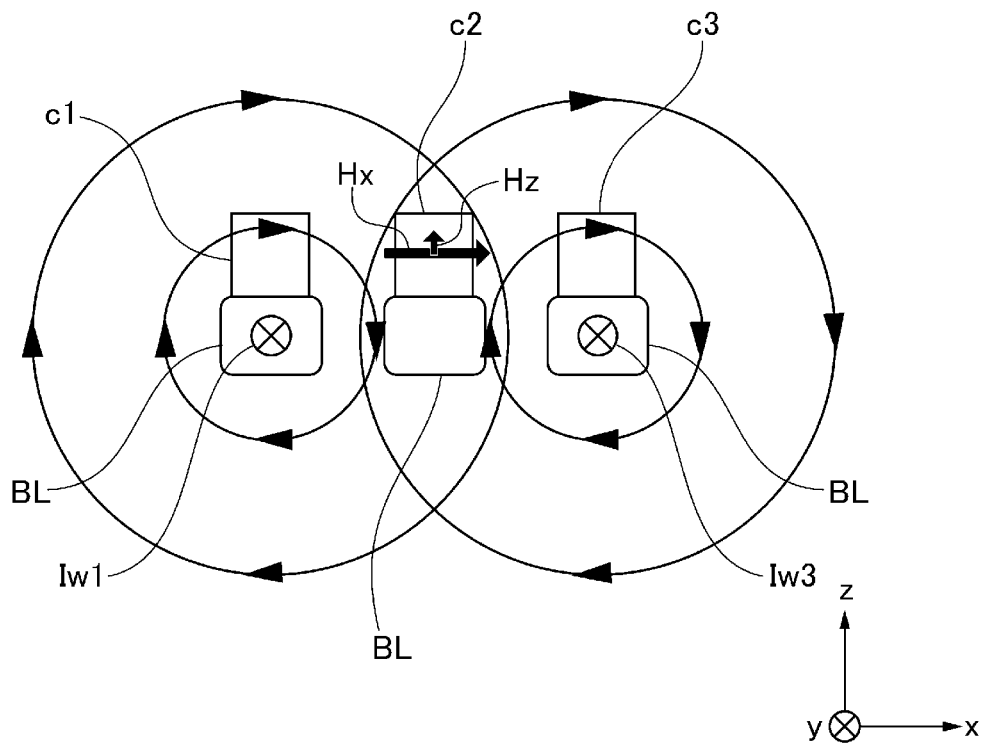
FIG. 2A is a schematic diagram illustrating magnitude and direction of a magnetic field that is applied to memory cells when the write current flows in the memory cell array of FIG. 1.
Figure 2B:
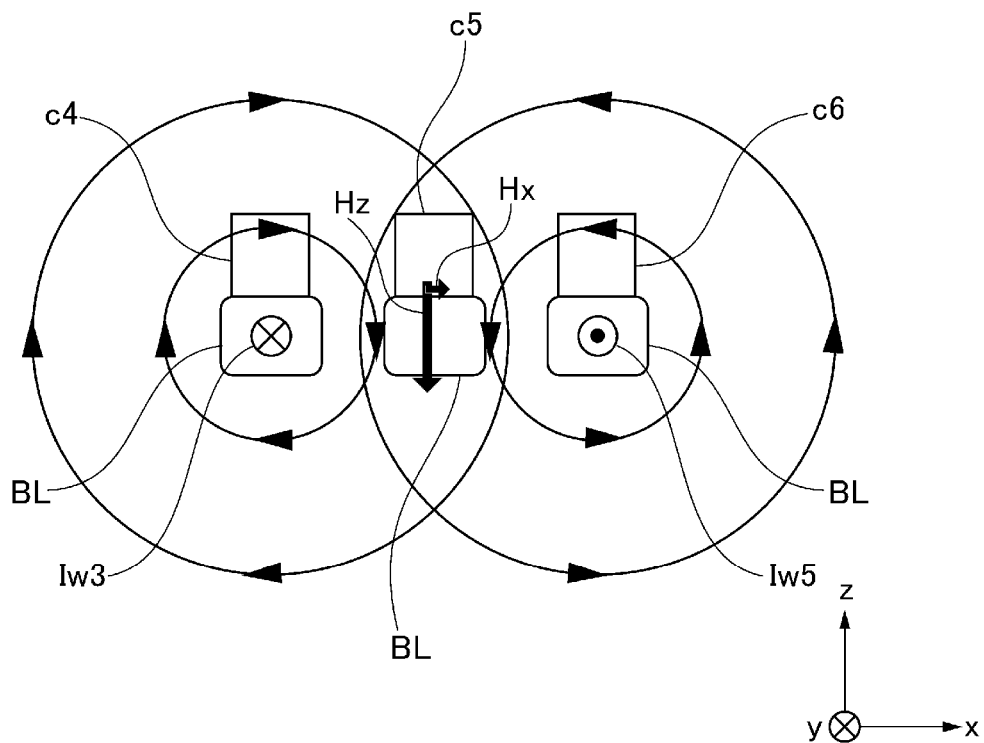
FIG. 2B is a schematic diagram illustrating the magnitude and direction of the magnetic field that is applied to the memory cells when the write current flows in the memory cell array of FIG. 1.
Figure 3:
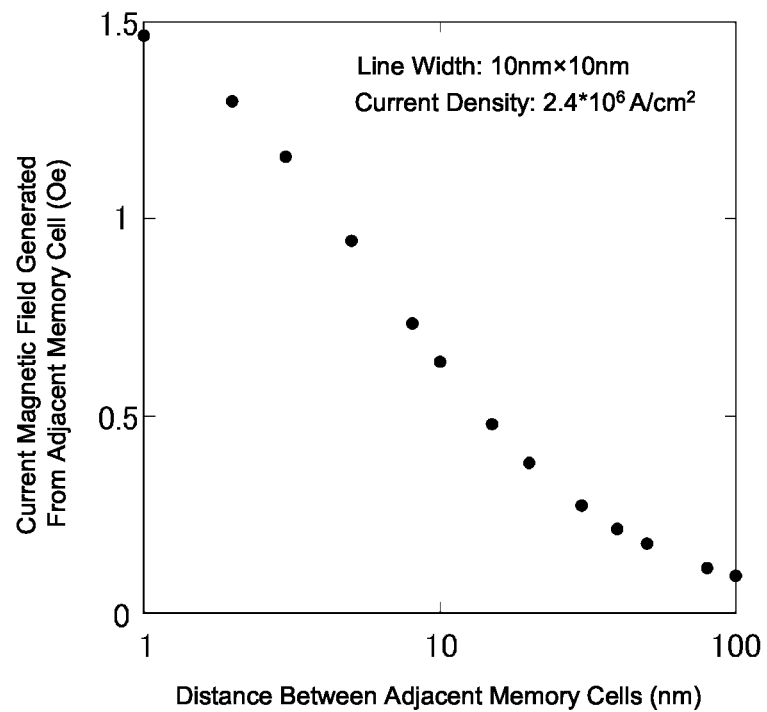
FIG. 3 is a graph showing a relationship between a distance between adjacent memory cells and a current magnetic field that is generated from the adjacent memory cells.
Figure 4A:
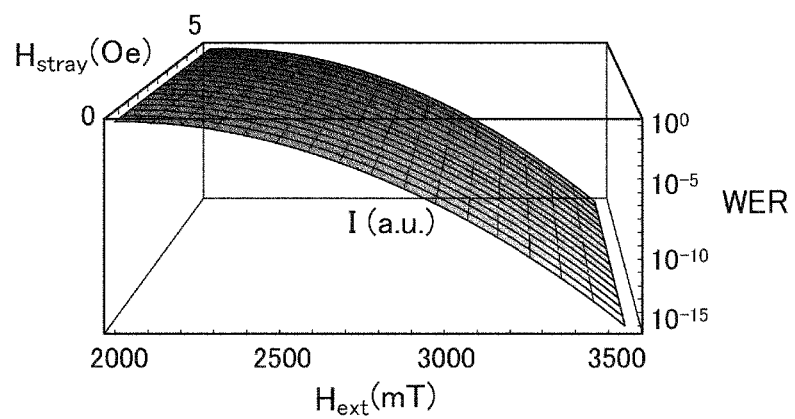
FIG. 4A is a graph showing an influence of a stray magnetic field on a write error rate.
Figure 4B:
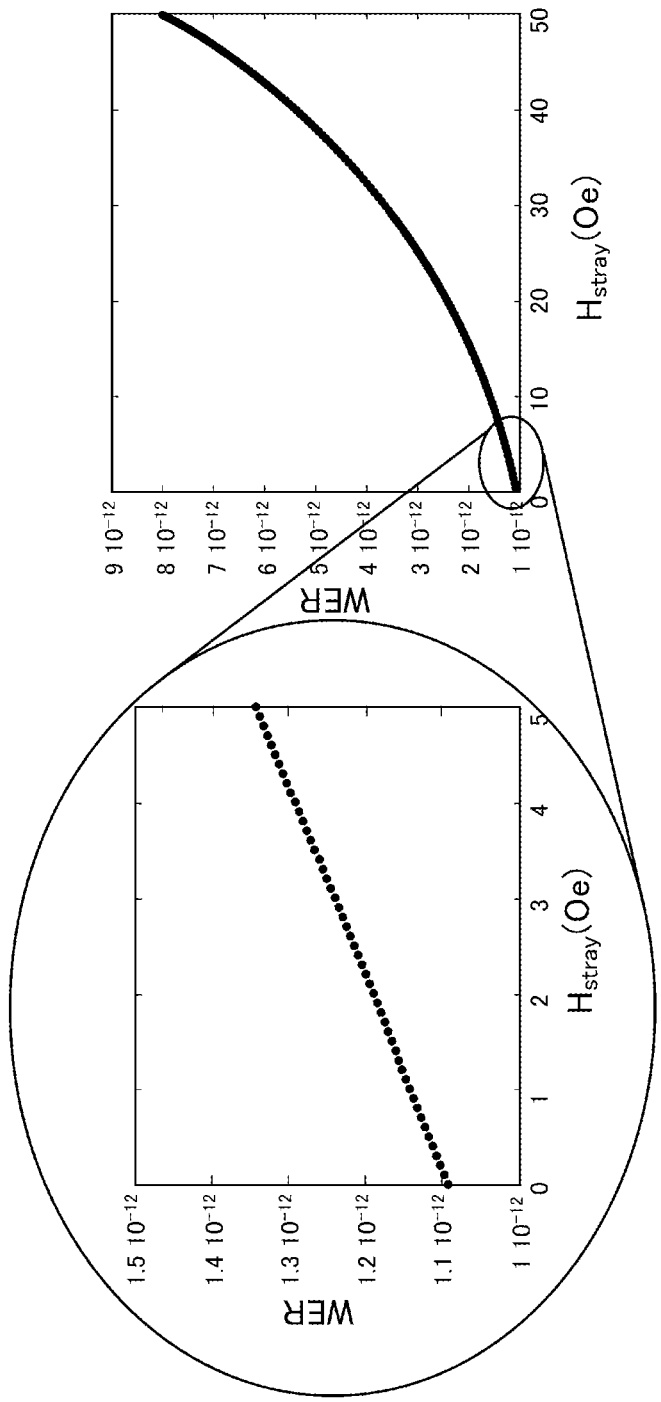
FIG. 4B is a graph showing the influence of the stray magnetic field on the write error rate.
Figure 5:
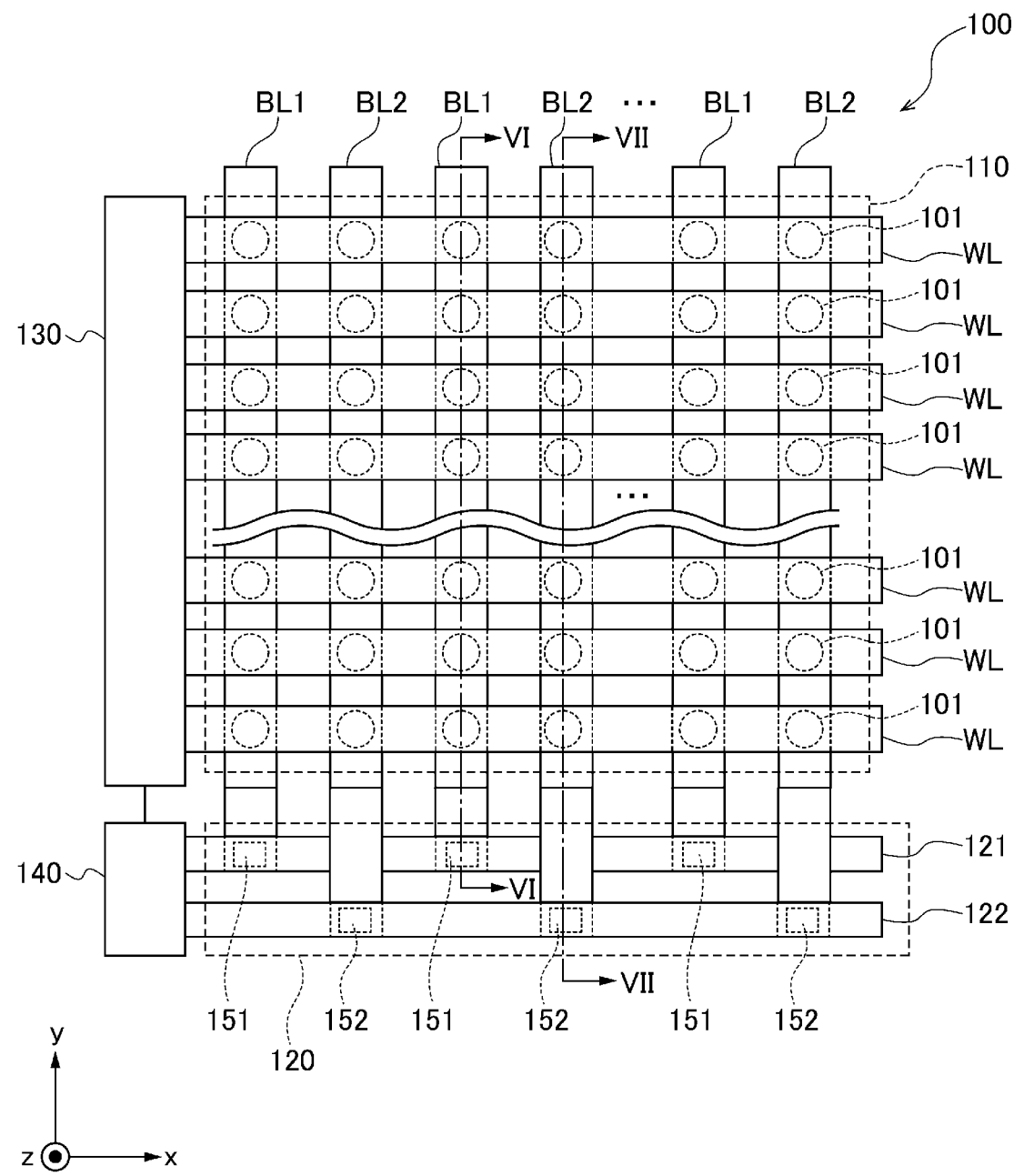
FIG. 5 is a schematic plan view of a magnetic memory device according to a first embodiment of the invention.

First, a first embodiment of the invention will be described with reference to FIG. 5 to FIG. 10. A magnetic memory device 100 of the first embodiment is a magnetic memory device using a spin transfer torque magnetic random access memory (STT-MRAM) (hereinafter, referred to as an "STT-MRAM device"). As shown in FIG. 5, the magnetic memory device 100 includes a memory cell array 110, a selection circuit 120, an X decoder 130, and a controller 140.

The memory cell array 110 is a cross-point memory cell array, and as shown in FIG. 5, includes a plurality of bit lines (a plurality of lines) in which bit lines BL1 of odd columns and bit lines BL2 of even columns are arranged parallel to one another at predetermined intervals, a plurality of word lines WL that intersect with the plurality of bit lines BL1 and BL2 and are arranged parallel to one another at predetermined intervals, and a plurality of memory cells 101 located at intersection points between the plurality of bit lines BL1 and BL2 and the plurality of word lines WL. As described above, the plurality of memory cells 101 are arranged in a matrix along an extending direction (y direction of FIG. 5) and an arrangement direction (x direction of FIG. 5) of the plurality of bit lines BL1 and BL2.

The memory cell 101 includes a magnetic tunnel junction element (hereinafter, referred to as an "MTJ element") as a magnetoresistive effect element, and a selector that is a switch element for selecting the MTJ element as an access target. The MTJ element and the selector are stacked in z direction of FIG. 5. The MTJ element of the memory cell 101 is an MTJ element having reversible magnetization by spin transfer torque (STT), and includes a recording layer made of a ferromagnet, a barrier layer made of an insulator, and a reference layer made of a ferromagnet. The recording layer, the barrier layer, and the reference layer of the MTJ element are stacked in this order or vice versa . The recording layer is connected to the bit line BL1 or BL2, and the reference layer is connected to the selector. The selector is connected to the word line WL. For example, as disclosed in Non-Patent Literature 1, an MTJ element with perpendicular magnetization and a two-terminal selector containing HfOx as a basic composition can be employed as the MTJ element and the selector of the memory cell 101, respectively. Alternatively, a two-terminal element that allows variable current of $10^5$ or more, which has been studied in a conductive-bridge memory having ionically conducting material such as Cu and Ag in Si/SiOx/SiN, can also be employed as the selector of the memory cell 101.

The selection circuit 120 includes a first control line 121 and a second control line 122. The odd bit lines BL1 are connected to the first control line 121 through transistors 151, and the even bit lines BL2 are connected to the second control line 122 through transistors 152. The details of connection between these components will be described below (See FIG. 6 and FIG. 7).

The X decoder 130 is connected to the plurality of word lines WL, and applies a voltage to the word line WL on the row of the access target, under the control of the controller 140.

The controller 140 is connected to the X decoder 130, the first control line 121, and the second control line 122, and controls each of the X decoder 130, the first control line 121, and the second control line 122, in accordance with data writing or data reading.

In writing data, the controller 140 separately controls the first control line 121 and the second control line 122 such that current flows through the odd bit lines BL1 and the even bit lines BL2 at different points in time. Here, the terms "different points in time" indicate that time when a write current flows through one of the adjacent bit lines is different from time when the write current flows through the other of the adjacent bit lines such that the write current does not simultaneously flow through the adjacent bit lines. The same applies to the terms "different points in time" in a second embodiment and a third embodiment. The details of write control of the controller 140 will be described below (See FIG. 8 and FIG. 9).

Next, the connection between the bit line BL1 and the first control line 121 and the connection between the bit line BL2 and the second control line 122 will be described in detail with reference to FIG. 6 and FIG. 7.

Figure 6:
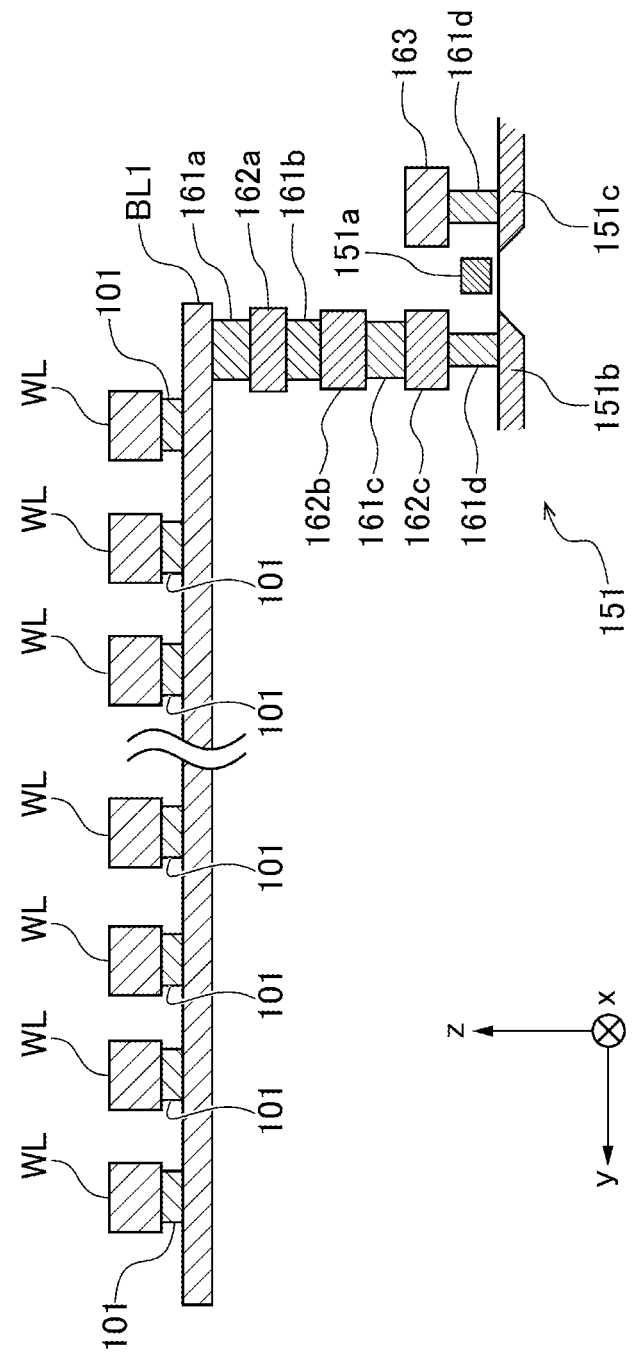
FIG. 6 is a sectional view of line VI-VI of FIG. 5.

FIG. 6 is a sectional view of line VI-VI of FIG. 5. The bit line BL1 is connected to the transistor 151. The transistor 151 is an electrical field effect transistor having a drain 151b connected to the bit line BL1, and a source 151c connected to a power supply line 163. Specifically, the transistor 151 is provided at a lower layer than the bit line BL1, and the bit line BL1 is connected to the drain 151b of the transistor 151 via through holes 161a, 161b, 161c, and 161d and metal electrode layers 162a, 162b, and 162c provided in an interlayer insulating film. The power supply line 163 is connected to the source 151c of the transistor 151 via the through hole 161d. A gate 151a of the transistor 151 is connected to the first control line 121, and when a voltage is applied to the gate 151a, a current flows through the bit line BL1.

Figure 7:
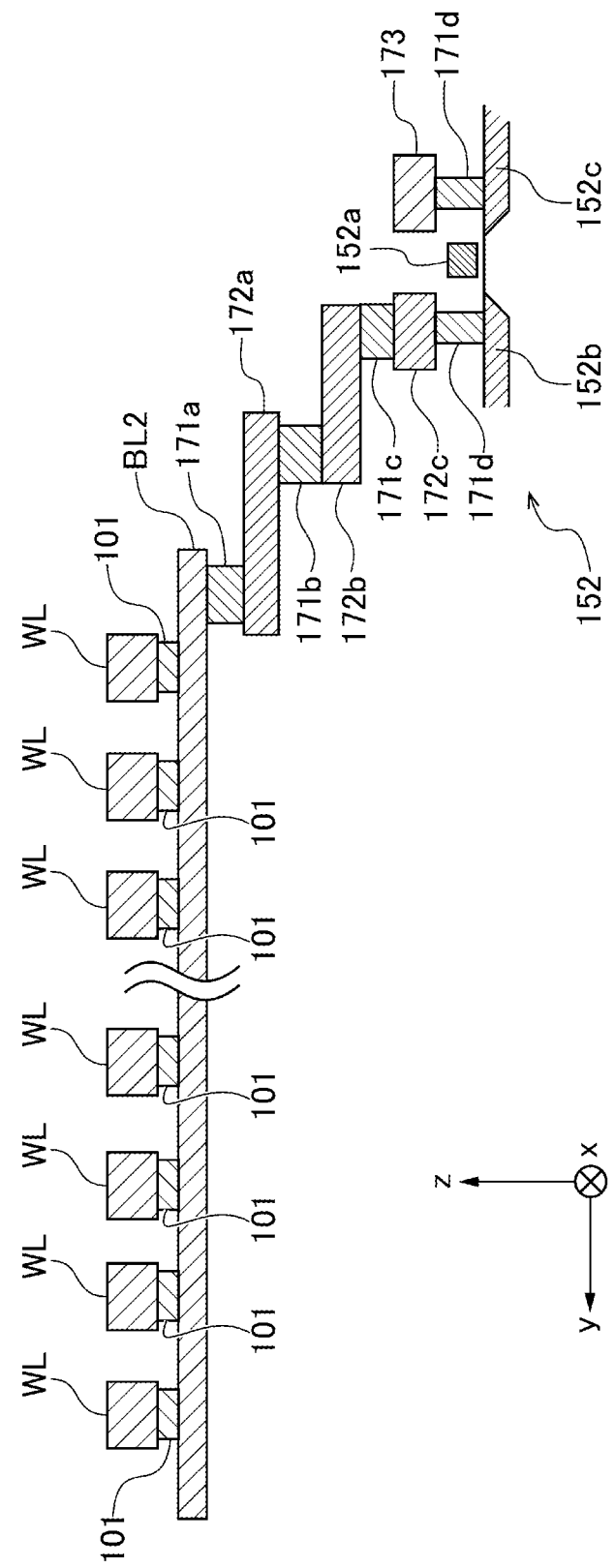
FIG. 7 is a sectional view of line VII-VII of FIG. 5.

FIG. 7 is a sectional view of line VII-VII of FIG. 5. The bit line BL2 is connected to the transistor 152. The transistor 152 is an electrical field effect transistor having a drain 152b connected to the bit line BL2, and a source 152c connected to a power supply line 173. Specifically, the transistor 152 is provided at a lower layer than the bit line BL2, and the bit line BL2 is connected to the drain 152b of the transistor 152 via through holes 171a, 171b, 171c, and 171d and metal electrode layers 172a, 172b, and 172c provided in an interlayer insulating film. The power supply line 173 is connected to the source 152c of the transistor 152 via the through hole 171d. A gate 152a of the transistor 152 is connected to the second control line 122, and when a voltage is applied to the gate 152a, a current flows through the bit line BL2.

As long as the first control line 121 and the second control line 122 are separately provided, it is possible to change a layout (FIG. 6) of the through holes and the metal electrode layers connecting between the bit line BL1 and the transistor 151 and to change a layout (FIG. 7) of the through holes and the metal electrode layers connecting between the bit line BL2 and the transistor 152.

Figure 8:
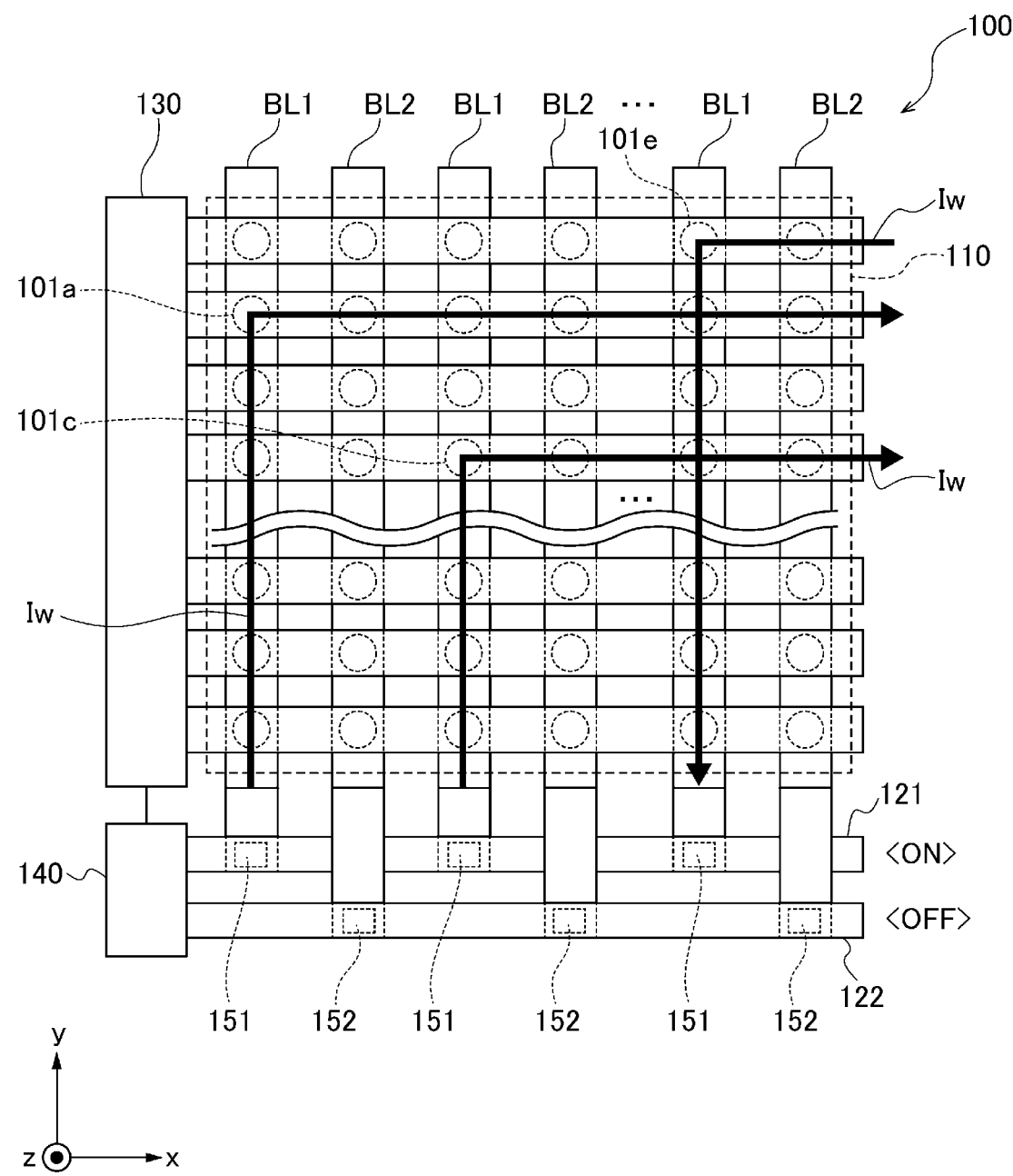
FIG. 8 is a schematic diagram illustrating a write operation when a transistor connected to a first control line is ON and a transistor connected to a second control line is OFF, in the magnetic memory device of the first embodiment.
Figure 9:
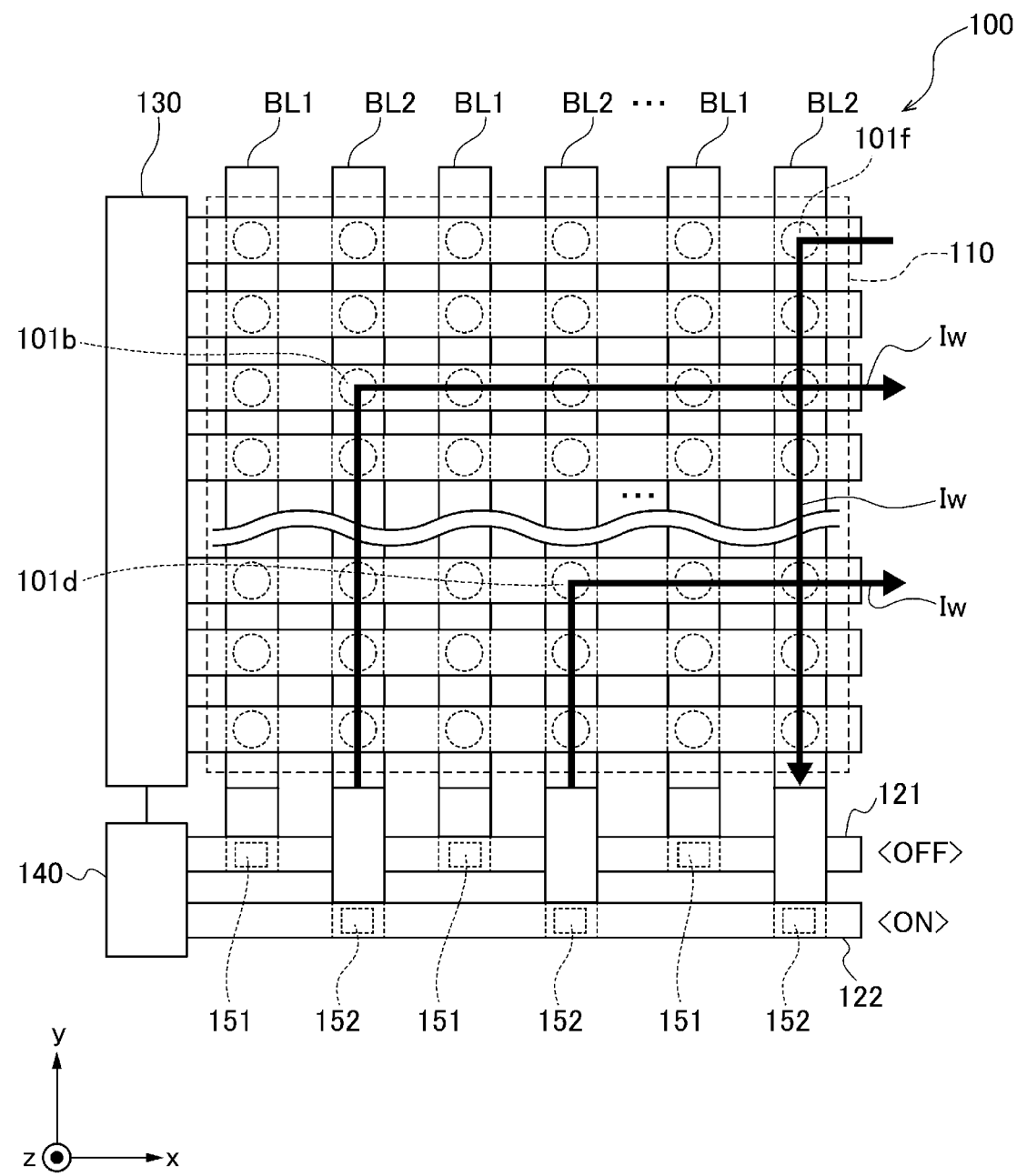
FIG. 9 is a schematic diagram illustrating a write operation when the transistor connected to the first control line is OFF and the transistor connected to the second control line is ON, in the magnetic memory device of the first embodiment.

Next, the write control of the controller 140 will be described with reference to FIG. 8 and FIG. 9. Reference will be made below to an example of writing data in memory cells 101a, 101c, and 101e connected to the odd bit lines BL1 and memory cells 101b, 101d, and 101f connected to the even bit lines BL2.

First, in accordance with data to be written, the controller 140 sets the potential of each of the bit line BL1 and the word line WL connected to the memory cell 101a, the potential of each of the bit line BL1 and the word line WL connected to the memory cell 101c, and the potential of each of the bit line BL1 and the word line WL connected to the memory cell 101e, and turns ON the selector of each of the memory cells 101a, 101c, and 101e. In addition, as shown in FIG. 8, the first control line 121 turns ON the transistors 151 connected to the bit lines BL1 (that is, applies a voltage to the gate 151a of each transistor 151), allowing a write current Iw to flow through each of the MTJ elements of the memory cells 101a, 101c, and 101e through each of the bit lines BL1. The direction of the write current Iw is determined by a potential difference between the bit line BL1 and the word line WL. When the write current Iw flows through each of the MTJ elements, data is written in each of the MTJ elements by spin transfer torque.

Next, the controller 140 turns OFF the transistors 151. And in accordance with data to be written, the controller 140 sets the potential of each of the bit line BL2 and the word line WL connected to the memory cell 101b, the potential of each of the bit line BL2 and the word line WL connected to the memory cell 101d, and the potential of each of the bit line BL2 and the word line WL connected to the memory cell 101f, and turns ON the selector of each of the memory cells 101b, 101d, and 101f. In addition, as shown in FIG. 9, the second control line 122 turns ON the transistors 152 connected to the bit lines BL2 (that is, applies a voltage to the gate 152a of each transistor 152), allowing a write current Iw to flow through each of the MTJ elements of the memory cells 101b, 101d, and 101f through each of the bit lines BL2. The direction of the write current Iw is determined by a potential difference between the bit line BL2 and the word line WL. When the write current Iw flows through each of the MTJ elements, data is written in each of the MTJ elements by spin transfer torque.

Although the write current flows through the odd bit lines BL1 before the write current flows through the even bit lines BL2 in the above example, the order may be reversed.

As described above, according to the magnetic memory device 100 of the first embodiment, the adjacent bit lines BL1 and BL2 are connected to the first control line 121 and the second control line 122, respectively, and in writing data, the controller 140 separately controls the first control line 121 and the second control line 122 such that the write current simultaneously flows through the non-adjacent bit lines BL1 or the non-adjacent bit lines BL2, and the write current flows through the adjacent bit lines BL1 and BL2 at different points in time. Accordingly, since the write current does not simultaneously flow through the adjacent bit lines BL1 and BL2, the influence of the magnetic field due to the write current can be reduced between the adjacent memory cells, and the occurrence of crosstalk can be suppressed. It is therefore possible to attain a low write error rate while reducing the write current. In addition, the number of memory cells connected in series can be increased, and high density and high capacity can be attained without significantly increasing the manufacturing cost. Further, data can be written collectively for each of the control lines, which makes it possible to achieve high-speed writing.

In FIG. 5 to FIG. 9, the magnetic memory device 100 including two control lines is shown, but the number of control lines is not particularly limited as long as the number of control lines is two or more. As the write current increases, the influence of a stray magnetic field may not be disregarded even when two control lines are separately controlled. Therefore, as shown in FIG. 10, the magnetic memory device may include three control lines, for example.

Figure 10:
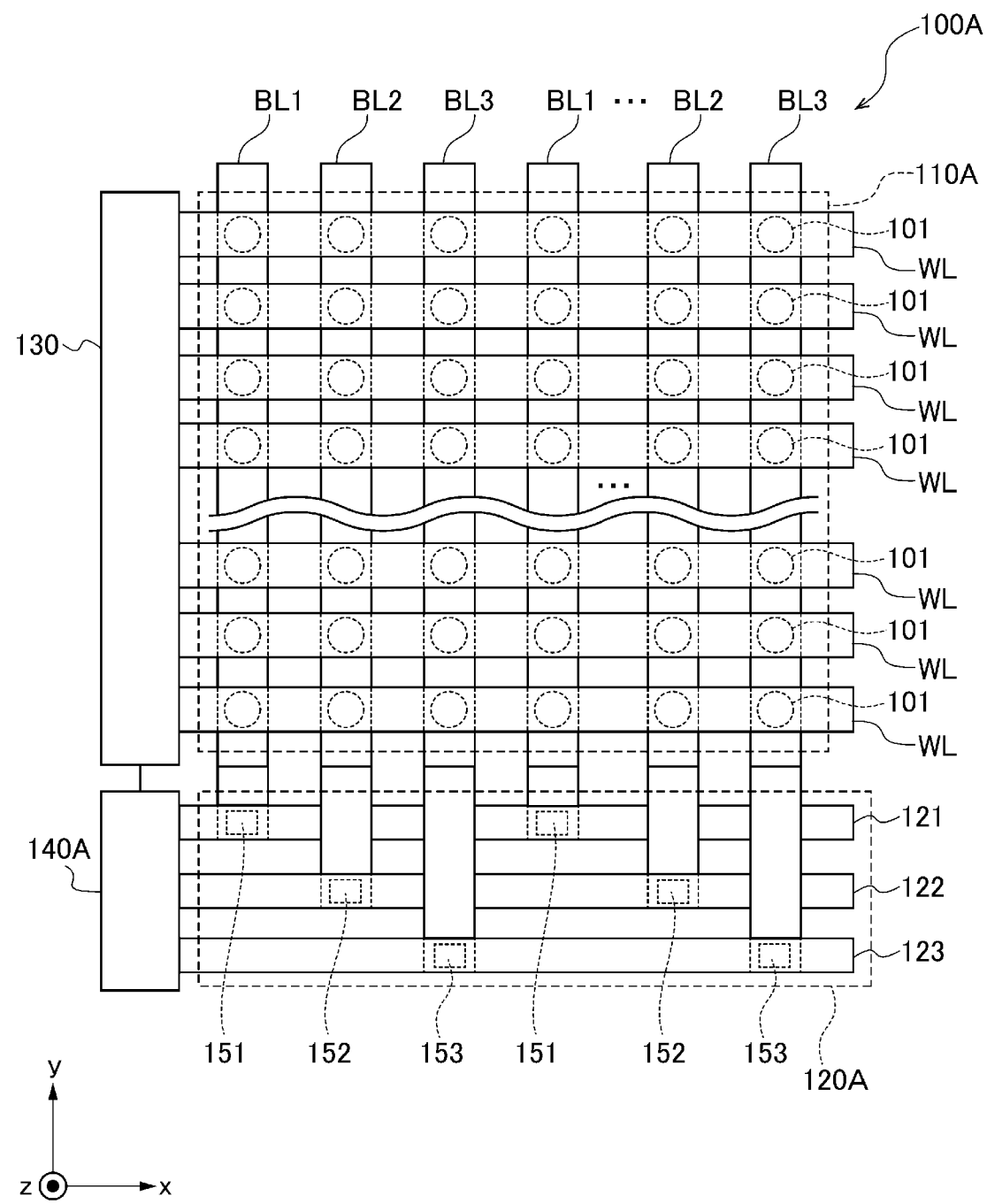
FIG. 10 is a schematic plan view of a magnetic memory device according to a modification example of the first embodiment.

A magnetic memory device 100A shown in FIG. 10 is an STT-MRAM device, and includes a memory cell array 110A, a selection circuit 120A, the X decoder 130, and a controller 140A.

The selection circuit 120A includes the first control line 121, the second control line 122, and a third control line 123.

As with the memory cell array 110, the memory cell array 110A is a cross-point memory cell array in which the memory cells 101 are located at intersection points between the plurality of bit lines (the bit lines BL1, BL2, and BL3) and the plurality of word lines WL. In the memory cell array 110A, the bit line BL1 of the (3n-2)-th column (n is a positive integer) is connected to the first control line 121 through the transistor 151, the bit line BL2 of the (3n-1)-th column is connected to the second control line 122 through the transistor 152, and the bit line BL3 of the 3n-th column is connected to the third control line 123 through a transistor 153. Each of the transistors 151, 152, and 153 is an electrical field effect transistor.

The controller 140A is connected to the X decoder 130, the first control line 121, the second control line 122, and the third control line 123, and controls each of the X decoder 130, the first control line 121, the second control line 122, and the third control line 123, in accordance with data writing or data reading.

In writing data on the memory cell array 110A, the controller 140A separately controls the first control line 121, the second control line 122, and the third control line 123 such that the write current flows through the adjacent bit lines at different points in time. For example, first, the transistor 151 connected to the first control line 121 is turned ON to allow the write current to flow through the bit line BL1 of the (3n-2)-th column. Next, the transistor 151 is turned OFF, and the transistor 152 connected to the second control line 122 is turned ON to allow the write current to flow through the bit line BL2 of the (3n-1)-th column. Next, the transistor 152 is turned OFF, and the transistor 153 connected to the third control line 123 is turned ON to allow the write current to flow through the bit line BL3 of the 3n-th column.

According to the magnetic memory device 100A shown in FIG. 10, even when a larger write current flows, the occurrence of crosstalk can be suppressed.

Second Embodiment

Next, a second embodiment of the invention will be described with reference to FIG. 11 to FIG. 17. A magnetic memory device 200 of the second embodiment is a one-transistor (Tra)-one-MTJ type STT-MRAM device, and as shown in FIG. 11, includes a memory cell array 210, a selection circuit 220, an X decoder 230, and a controller 240.

Figure 11:
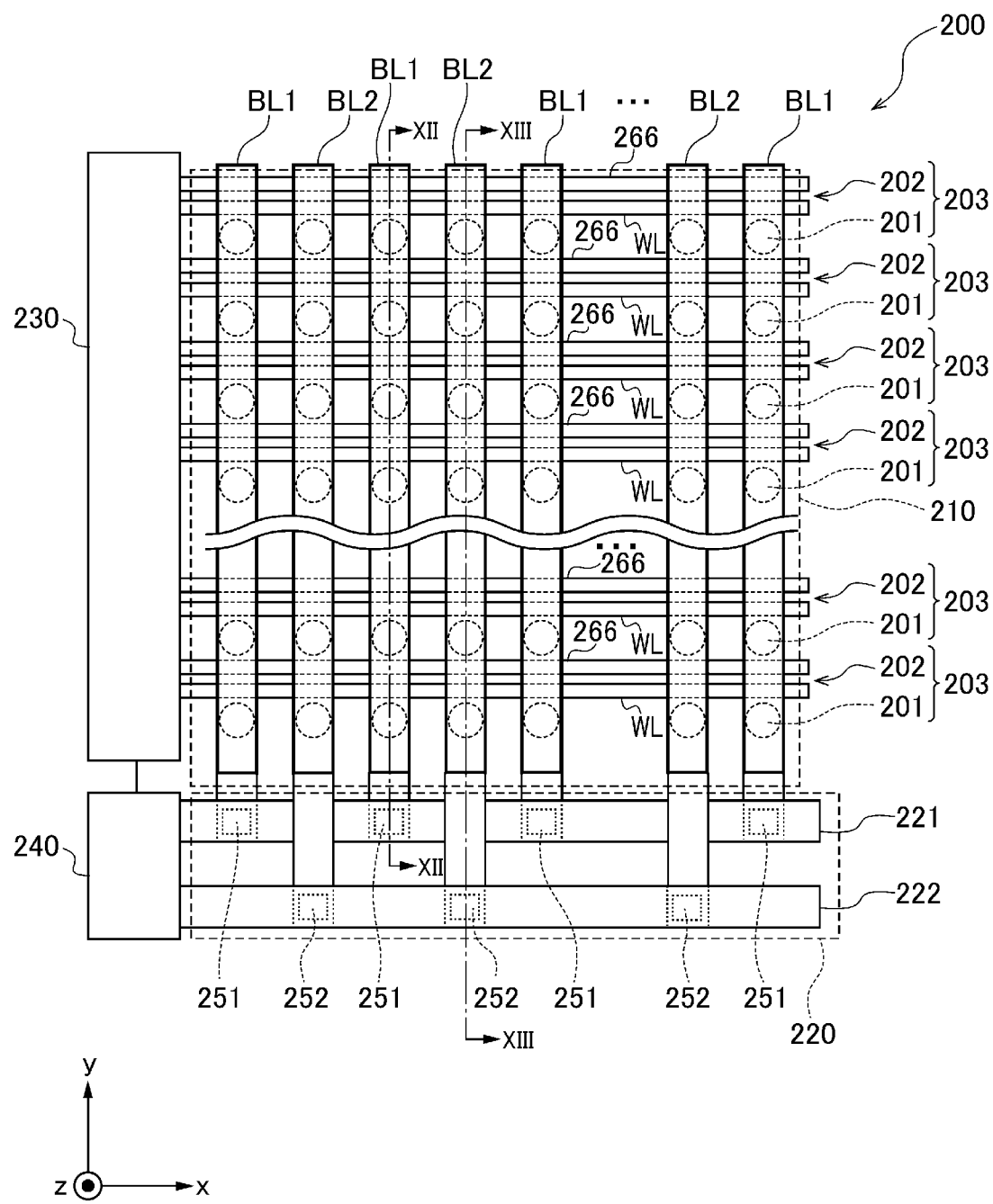
FIG. 11 is a schematic plan view of a magnetic memory device according to a second embodiment of the invention.

As shown in FIG. 11, the memory cell array 210 includes a plurality of bit lines (a plurality of lines) in which odd bit lines BL1 and even bit lines BL2 are arranged parallel to one another at predetermined intervals, a plurality of word lines WL that intersect with the plurality of bit lines BL1 and BL2 and are arranged parallel to one another at predetermined intervals, and a plurality of memory cells 203 disposed in regions where the plurality of bit lines BL1 and BL2 intersect with the plurality of word lines WL. As described above, the plurality of memory cells 203 are arranged in a matrix along an extending direction (y direction of FIG. 11) and an arrangement direction (x direction of FIG. 11) of the plurality of bit lines BL1 and BL2.

The memory cell 203 includes an MTJ element 201 as a magnetoresistive effect element, and a selection transistor 202 that is a switch element for selecting the MTJ element 201 as an access target. The MTJ element 201 is an MTJ element having reversible magnetization by spin transfer torque (STT), and includes a recording layer made of a ferromagnet, a barrier layer made of an insulator, and a reference layer made of a ferromagnet. The recording layer, the barrier layer, and the reference layer of the MTJ element 201 are stacked in this order. The recording layer is connected to the bit line BL1 or BL2, and the reference layer is connected to a drain 202b of the selection transistor 202 (See FIG. 12 and FIG. 13). A gate 202a of the selection transistor 202 is connected to the word line WL, and a source 202c thereof is connected to a source line 266 (See FIG. 12 and FIG. 13). As described above, the memory cell 203 is a 1Tra-1MTJ type memory cell including one selection transistor 202 and one MTJ element 201.

The selection circuit 220 includes a first control line 221 and a second control line 222. The odd bit lines BL1 are connected to the first control line 221 through transistors 251, and the even bit lines BL2 are connected to the second control line 222 through transistors 252. The details of connection between these components will be described below (See FIG. 12 and FIG. 13).

The X decoder 230 is connected to the plurality of word lines WL and the plurality of source lines 266, and applies a voltage to each of the word lines WL and the source line 266 of the row of the access target, under the control of the controller 240.

The controller 240 is connected to the X decoder 230, the first control line 221, and the second control line 222, and controls each of the X decoder 230, the first control line 221, and the second control line 222, in accordance with data writing or data reading.

In writing data, the controller 240 separately controls the first control line 221 and the second control line 222 such that a write current flows through the odd bit lines BL1 and the even bit lines BL2 at different points in time. Write control of the controller 240 will be described below.

Next, the connection between the bit line BL1 and the first control line 221, the connection between the bit line BL2 and the second control line 222, and the connection between the MTJ element 201 and the corresponding selection transistor 202 will be described in detail with reference to FIG. 12 and FIG. 13.

Figure 12:
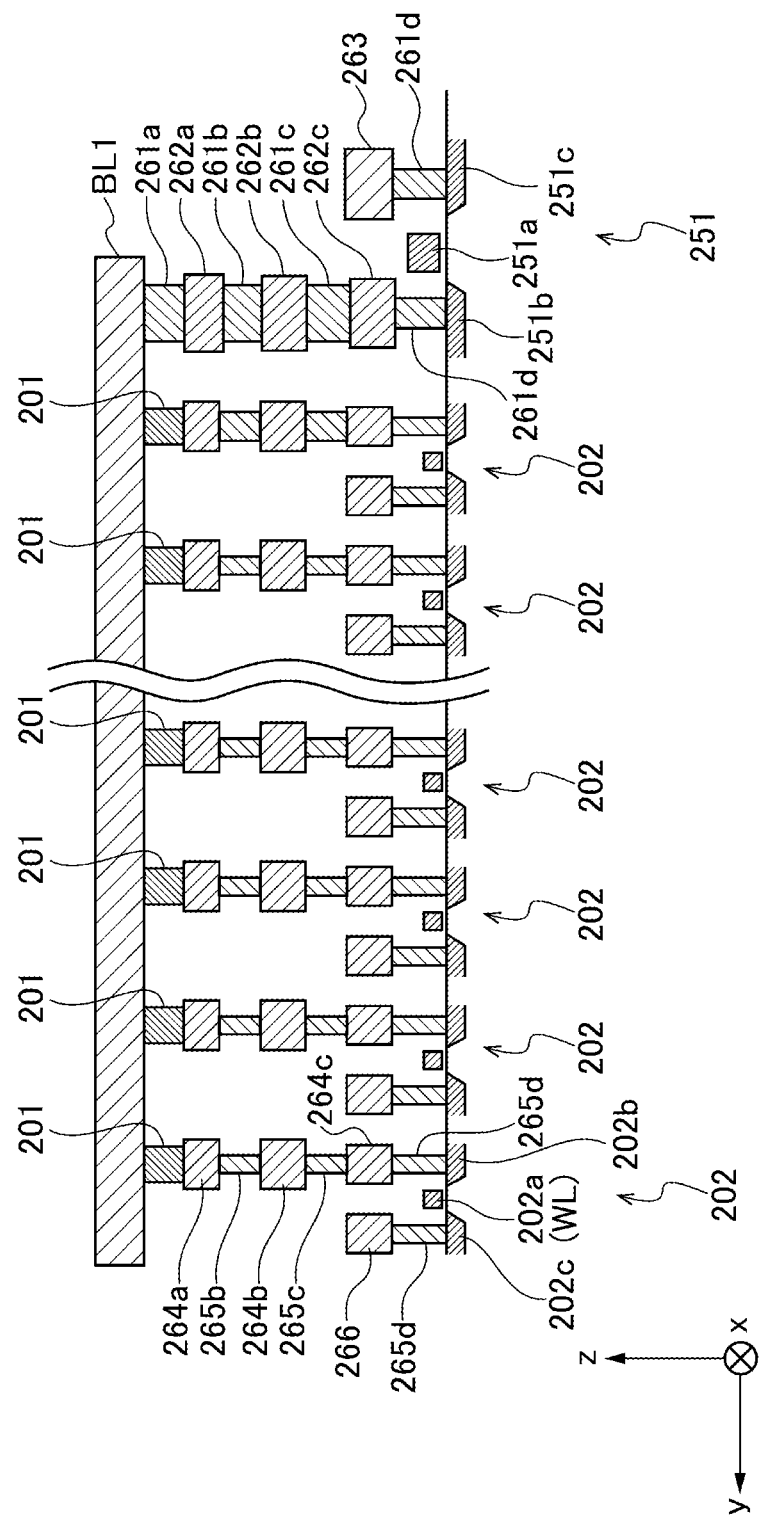
FIG. 12 is a sectional view of line XII-XII of FIG. 11.

FIG. 12 is a sectional view of line XII-XII of FIG. 11. The bit line BL1 is connected to the transistor 251. The transistor 251 is an electrical field effect transistor having a drain 251$b$ connected to the bit line BL1, and a source 251$c$ connected to a power supply line 263. Specifically, the transistor 251 is provided at a lower layer than the bit line BL1, and the bit line BL1 is connected to the drain 251$b$ of the transistor 251 via through holes 261$a$, 261$b$, 261$c$, and 261$d$ and metal electrode layers 262$a$, 262$b$, and 262$c$ provided in an interlayer insulating film. The power supply line 263 is connected to the source 251$c$ of the transistor 251 via the through hole 261$d$. A gate 251$a$ of the transistor 251 is connected to the first control line 221, and when a voltage is applied to the gate 251$a$, a current flows through the bit line BL1.

The MTJ element 201 connected to the bit line BL1 is connected to the drain 202$b$ of the selection transistor 202 via through holes 265$a$, 265$c$, and 265$d$ provided in an interlayer insulating film, and metal electrode layers 264$a$, 264$b$, and 264$c$. The source 202$c$ of the selection transistor 202 is connected to the source line 266 via the through hole 265$d$, and the gate 202$a$ is connected to the word line WL. The selection transistor 202 and the transistor 251 are provided in active regions on a semiconductor substrate, and the active regions are isolated by shallow trench isolation regions.

Figure 13:
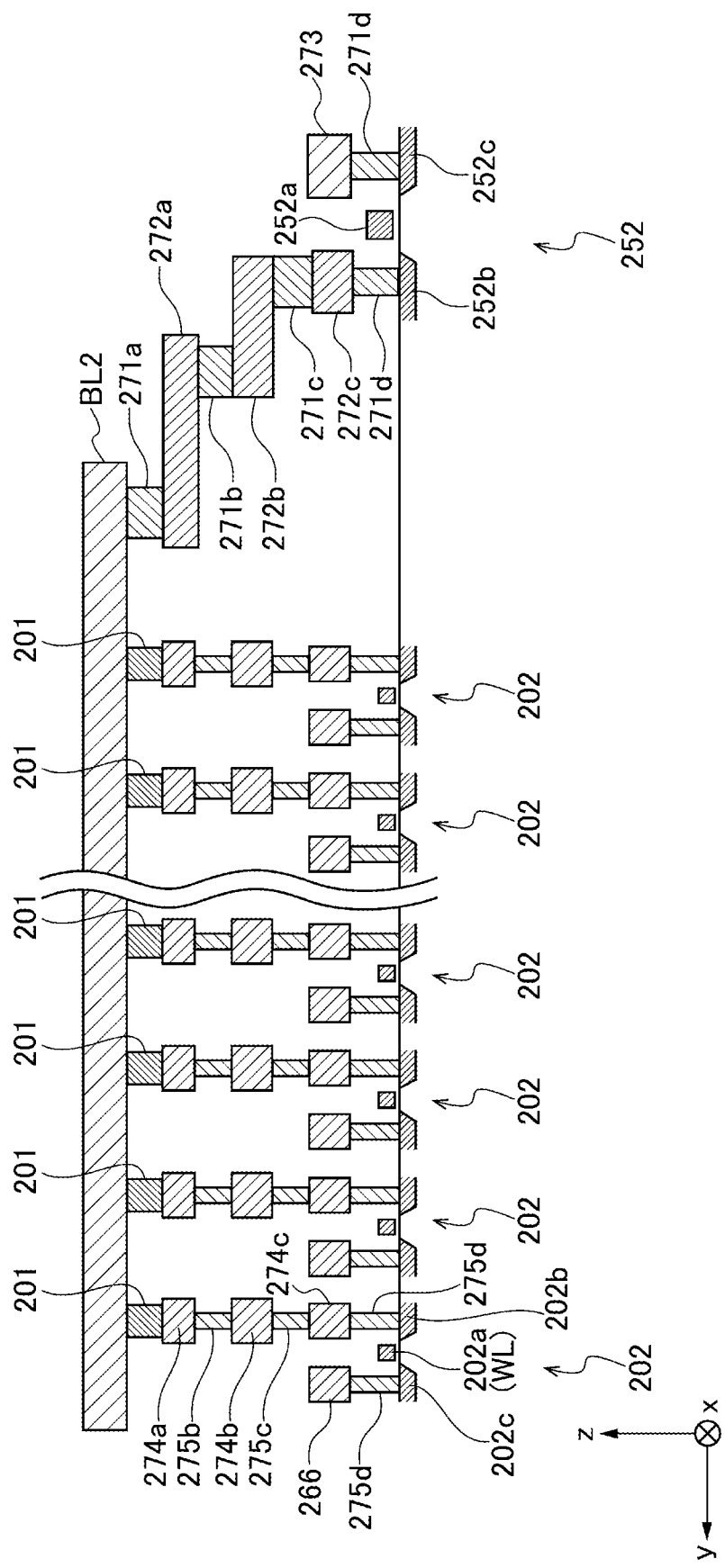
FIG. 13 is a sectional view of line XIII-XIII of FIG. 11.

FIG. 13 is a sectional view of line XIII-XIII of FIG. 11. The bit line BL2 is connected to the transistor 252. The transistor 252 is an electrical field effect transistor having a drain 252$b$ connected to the bit line BL2, and a source 252$c$ connected to a power supply line 273. Specifically, the transistor 252 is provided at a lower layer than the bit line BL2, and the bit line BL2 is connected to the drain 252$b$ of the transistor 252 via through holes 271$a$, 271$b$, 271$c$, and 271$d$ and metal electrode layers 272$a$, 272$b$, and 272$c$ provided in an interlayer insulating film. The power supply line 273 is connected to the source 252$c$ of the transistor 252 via the through hole 271$d$. A gate 252$a$ of the transistor 252 is connected to the second control line 222, and when a voltage is applied to the gate 252$a$, and a current flows through the bit line BL2.

The MTJ element 201 connected to the bit line BL2 is connected to the drain 202$b$ of the selection transistor 202 via through holes 275$a$, 275$c$, and 275$d$ provided in an interlayer insulating film, and metal electrode layers 274$a$, 274$b$, and 274$c$. The source 202$c$ of the selection transistor 202 is connected to the source line 266 via the through hole 275$d$, and the gate 202$a$ is connected to the word line WL. The selection transistor 202 and the transistor 252 are provided in active regions on a semiconductor substrate, and the active regions are isolated by shallow trench isolation regions.

As long as the first control line 221 and the second control line 222 are separately provided, it is possible to change a layout (FIG. 12) of the through holes and the metal electrode layers connecting between the bit line BL1 and the transistor 251 and to change a layout (FIG. 13) of the through holes and the metal electrode layers connecting between the bit line BL2 and the transistor 252.

Next, the write control of the controller 240 will be described. In an example below, the write current flows through the odd bit lines BL1 before the write current flows through the even bit lines BL2, but the order may be reversed.

First, in accordance with data to be written, the controller 240 sets the potential of the odd bit line BL1 connected to the memory cell 203 on which data will be written, and the potential of the source 202$c$ of the selection transistor 202 (the source line 266) of the memory cell 203. The direction of the write current is determined by a potential difference between the bit line BL1 and the source 202$c$ of the selection transistor 202. In addition, the controller 240 turns ON the selection transistor 202 by applying a voltage to the gate 202$a$ of the selection transistor 202 from the word line WL corresponding to the memory cell 203, and causes the first control line 221 to turn ON the transistor 251 connected to the bit line BL1. Accordingly, the write current flows through the bit line BL1 and the MTJ element 201, causing reversal of the magnetization of the MTJ element 201 by spin transfer torque, thereby writing data on the memory cell 203.

Next, the controller 240 turns OFF the transistor 251. And in accordance with data to be written, the controller 240 sets the potential of the even bit line BL2 connected to the memory cell 203 on which data will be written, and the potential of the source 202$c$ of the selection transistor 202 (the source line 266) of the memory cell 203. The direction of the write current is determined by a potential difference between the bit line BL2 and the source 202$c$ of the selection transistor 202. In addition, the controller 240 turns ON the selection transistor 202 by applying a voltage to the gate 202$a$ of the selection transistor 202 from the word line WL corresponding to the memory cell 203, and causes the second control line 222 to turn ON the transistor 252 connected to the bit line BL2. Accordingly, the write current flows through the bit line BL2 and the MTJ element 201, causing reversal of the magnetization of the MTJ element 201 by spin transfer torque, thereby writing data on the memory cell 203.

According to the magnetic memory device 200 of the second embodiment, the same effects as those of the magnetic memory device 100 of the first embodiment can be obtained. In the magnetic memory device 200, since each of the memory cells 203 includes the selection transistor 202, the memory cells 203 in y direction of FIG. 11 are not closely arranged compared to the memory cells 101 of the cross-point magnetic memory device 100. However, in the high-capacity magnetic memory device 200, the memory cells 203 are closely arranged in the arrangement direction (x direction of FIG. 11) of the bit lines BL1 and BL2. Thus, as with the second embodiment, it is effective that a current flows through the adjacent bit lines at different points in time by separately controlling the first control line 221 and the second control line 222.

In FIG. 11 to FIG. 13, the magnetic memory device 200 including two control lines is shown, but the number of control lines is not particularly limited as long as the number of control lines is two or more. As the write current increases, the influence of a stray magnetic field may not be disregard even when two control lines are separately controlled. Therefore, as shown in FIG. 14, the magnetic memory device may include three control lines, for example.

Figure 14:
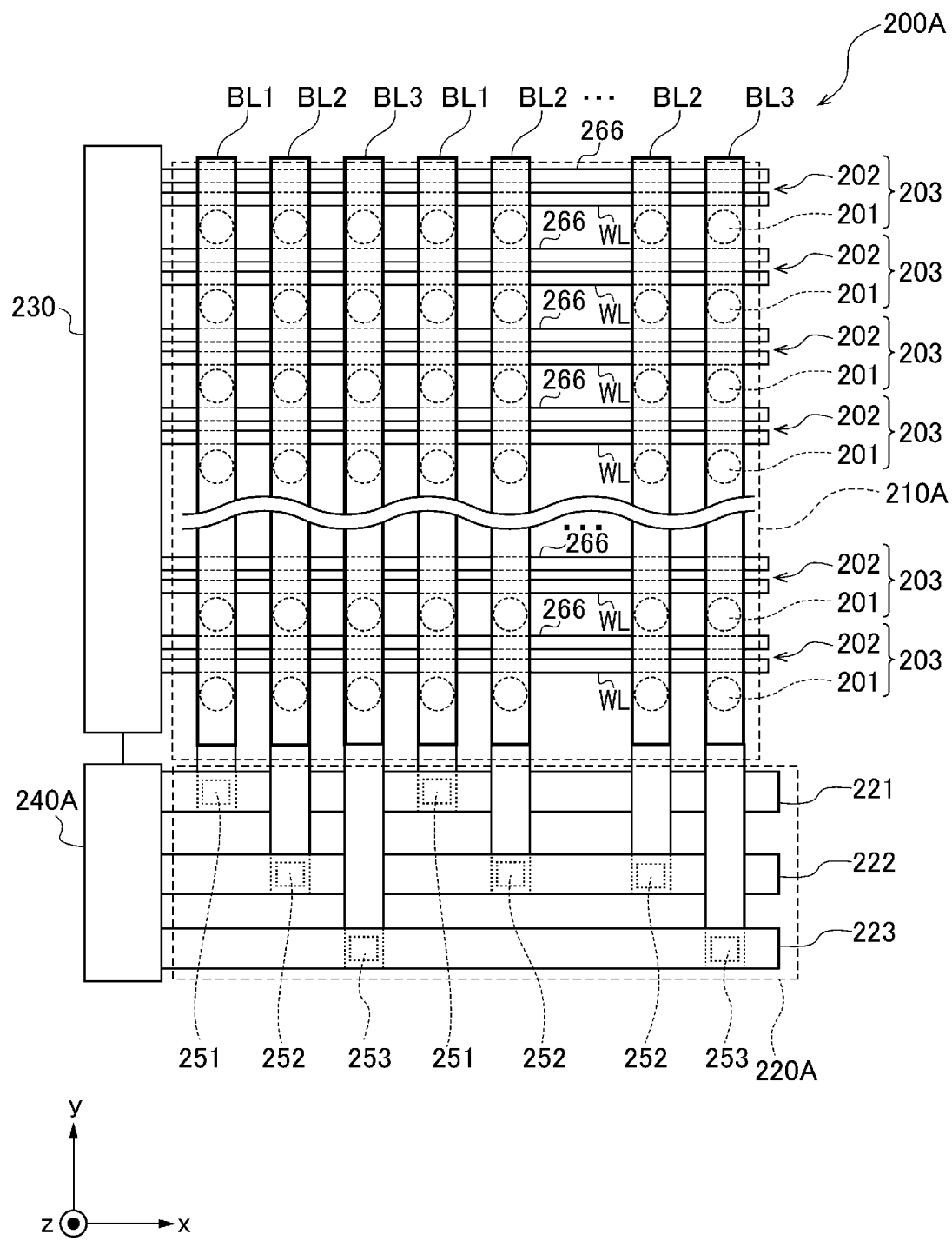
FIG. 14 is a schematic plan view of a magnetic memory device according to a modification example of the second embodiment.

A magnetic memory device 200A shown in FIG. 14 is an STT-MRAM device, and includes a memory cell array 210A, a selection circuit 220A, the X decoder 230, and a controller 240A.

The selection circuit 220A includes the first control line 221, the second control line 222, and a third control line 223.

The memory cell 203 of the memory cell array 210A is also a 1Tra-1MTJ type memory cell including one MTJ element 201 and one selection transistor 202. In the memory cell array 210A, the bit line BL1 of the (3n-2)-th column (n is a positive integer) is connected to the first control line 221 through the transistor 251, the bit line BL2 of the (3n-1)-th column is connected to the second control line 222 through the transistor 252, and the bit line BL3 of the 3n-th column is connected to the third control line 223 through a transistor 253. Each of the transistors 251, 252, and 253 is an electrical field effect transistor.

The controller 240A is connected to the X decoder 230, the first control line 221, the second control line 222, and the third control line 223, and controls each of the X decoder 230, the first control line 221, the second control line 222, and the third control line 223, in accordance with data writing or data reading.

In writing data on the memory cell array 210A, the controller 240A separately controls the first control line 221, the second control line 222, and the third control line 223 such that the write current flows through the adjacent bit lines at different points in time. For example, first, the transistor 251 connected to the first control line 221 is turned ON to allow the write current to flow through the bit line BL1 of the (3n-2)-th column. Next, the transistor 251 is turned OFF, and the transistor 252 connected to the second control line 222 is turned ON to allow the write current to flow through the bit line BL2 of the (3n-1)-th column. Next, the transistor 252 is turned OFF, and the transistor 253 connected to the third control line 223 is turned ON to allow the write current to flow through the bit line BL3 of the 3n-th column.

According to the magnetic memory device 200A shown in FIG. 14, even when a larger write current flows, the occurrence of crosstalk can be suppressed.

Figure 15:
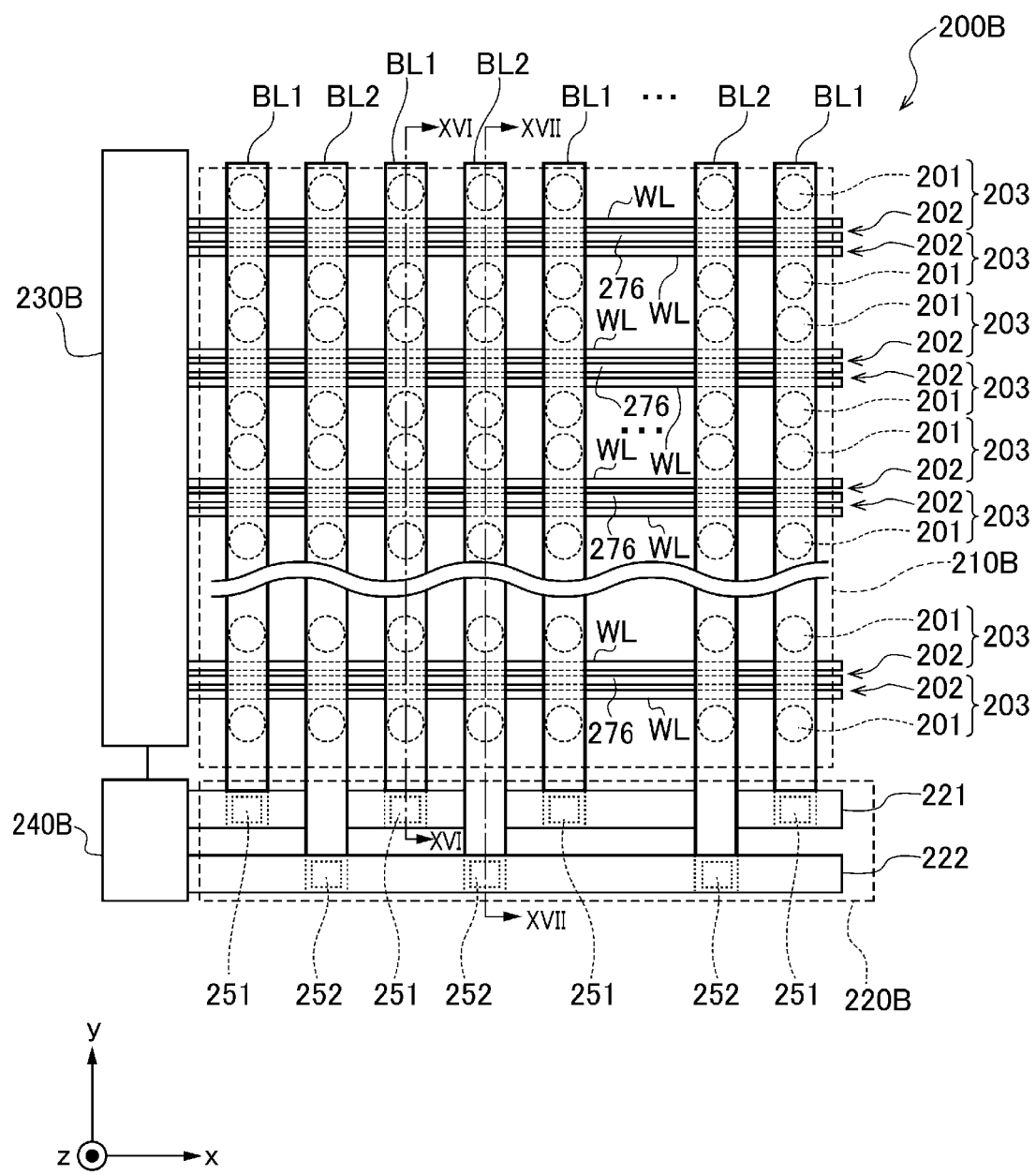
FIG. 15 is a schematic plan view of a magnetic memory device according to another modification example of the second embodiment.
Figure 16:
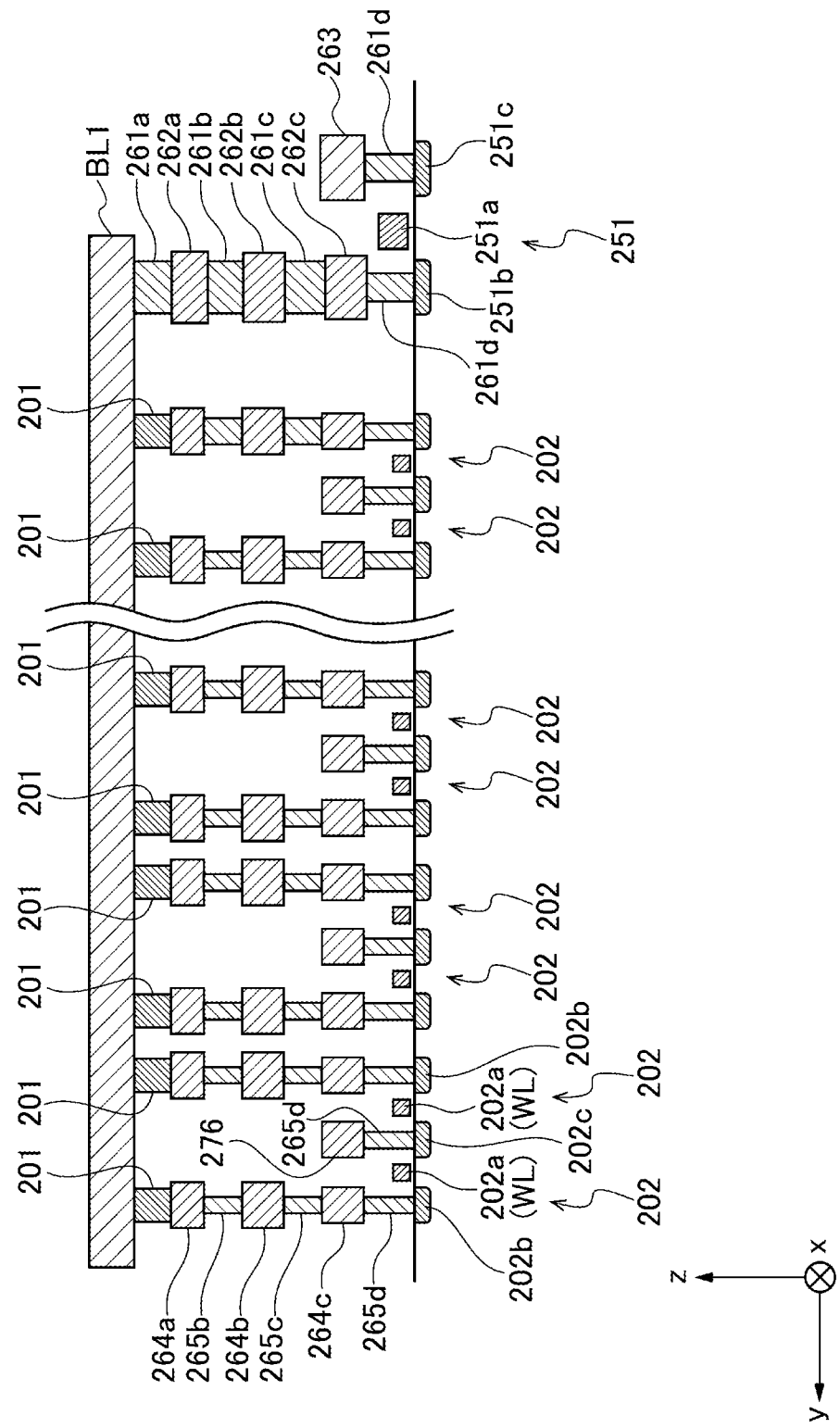
FIG. 16 is a sectional view of line XVI-XVI of FIG. 15.
Figure 17:
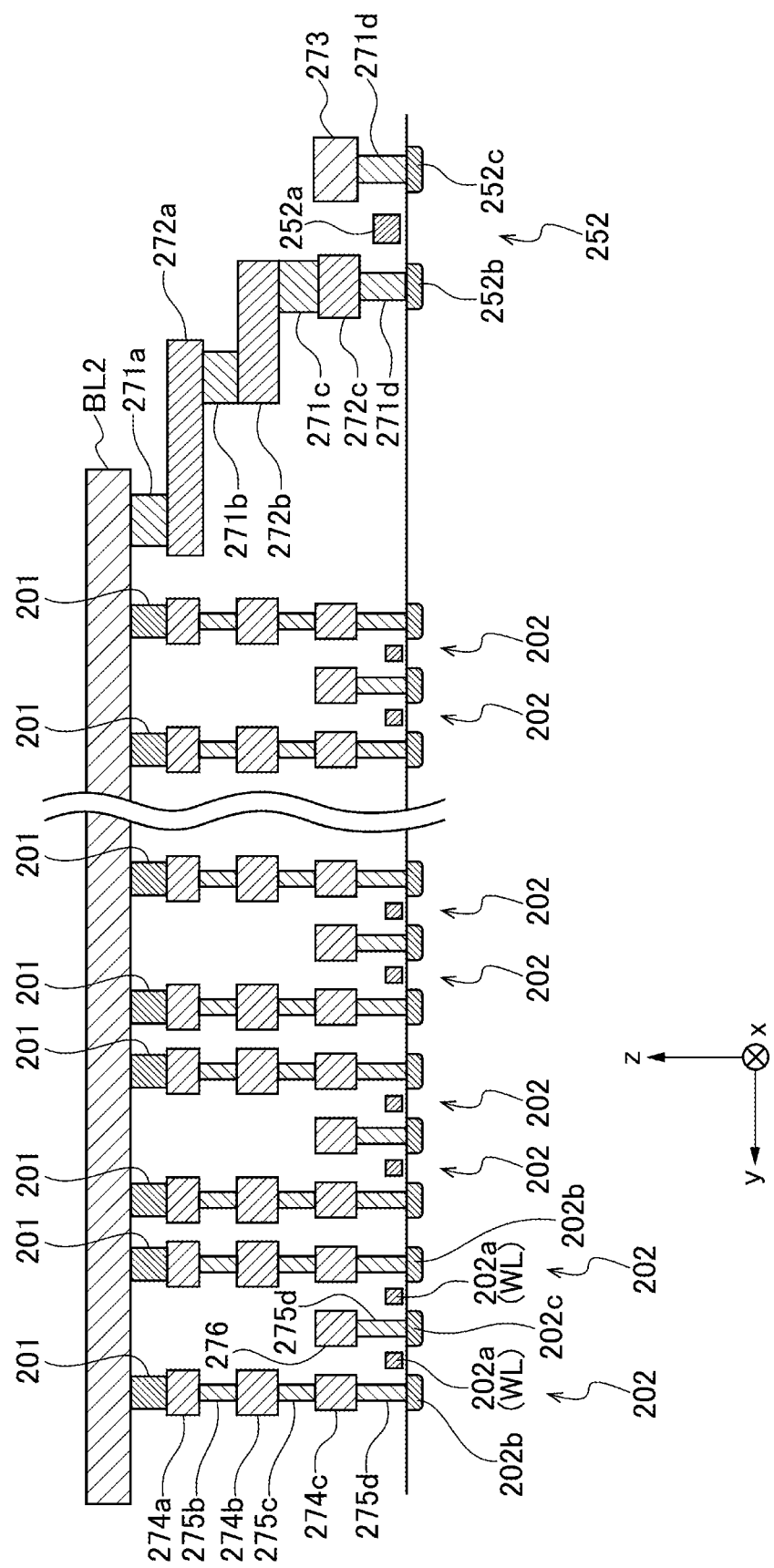
FIG. 17 is a sectional view of line XVII-XVII of FIG. 15.

In the magnetic memory device 200 shown in FIG. 11 to FIG. 13 and the magnetic memory device 200A shown in FIG. 14, one source line 266 is provided for every row of the memory cell array, but as shown in FIG. 15 to FIG. 17, one source line may be provided for every two adjacent rows.

A magnetic memory device 200B shown in FIG. 15 is an STT-MRAM device, and includes a memory cell array 210B, a selection circuit 220B, an X decoder 230B, and a controller 240B.

The selection circuit 220B includes the first control line 221 and the second control line 222.

The controller 240B is connected to the X decoder 230B, the first control line 221, and the second control line 222, and controls each of the X decoder 230B, the first control line 221, and the second control line 222, in accordance with data writing or data reading.

The magnetic memory device 200B is different from the magnetic memory device 200 shown in FIG. 11 to FIG. 13 in that one source line 276 is provided for every two adjacent rows of the memory cell array 210B. The connection between the odd bit lines BL1 and the first control line 221, the connection between the even bit lines BL2 and the second control line 222, and write control of the controller 240B are identical to those of the magnetic memory device 200, and therefore will be omitted. Hereinafter, only a structural difference from the magnetic memory device 200 will be described.

FIG. 16 is a sectional view of line XVI-XVI of FIG. 15. The MTJ element 201 connected to the bit line BL1 is connected to the drain 202b of the selection transistor 202 via the through holes 265a, 265c, and 265d provided in the interlayer insulating film, and the metal electrode layers 264a, 264b, and 264c. The source 202c of the selection transistor 202 is connected to the source line 276 via the through hole 265d, and the gate 202a is connected to the word line WL. Two adjacent selection transistors 202 in a row direction (y direction of FIG. 16) share the source 202c with each other, and are connected to the common source line 276. The selection transistors 202 are provided in active regions on a semiconductor substrate, and the active regions are isolated by shallow trench isolation regions.

FIG. 17 is a sectional view of line XVII-XVII of FIG. 15. The MTJ element 201 connected to the bit line BL2 is connected to the drain 202b of the selection transistor 202 via the through holes 275a, 275c, and 275d provided in the interlayer insulating film, and the metal electrode layers 274a, 274b, and 274c. The source 202c of the selection transistor 202 is connected to the source line 276 via the through hole 275d, and the gate 202a is connected to the word line WL. Two adjacent selection transistors 202 in the row direction (y direction of FIG. 17) share the source 202c with each other, and are connected to the common source line 276. The selection transistors 202 are provided in active regions on a semiconductor substrate, and the active regions are isolated by shallow trench isolation regions.

As described above, since the source 202c is shared by the two adjacent selection transistors 202 in the row direction of the memory cell array 210B, the memory cells 203 can be more closely arranged in the row direction, and high capacity can be attained.

Needless to say, the magnetic memory device 200B of FIG. 15 to FIG. 17 may include three or more control lines.

Third Embodiment

Next, a third embodiment of the invention will be described with reference to FIG. 18 to FIG. 21. A magnetic memory device 300 of the third embodiment is a magnetic memory device using a spin-orbit torque magnetic random access memory (SOT-MRAM) (hereinafter, referred to as an "SOT-MRAM device"), and as shown in FIG. 18, includes a memory cell array 310, a selection circuit 320, an X decoder 330, and a controller 340.

Figure 18:
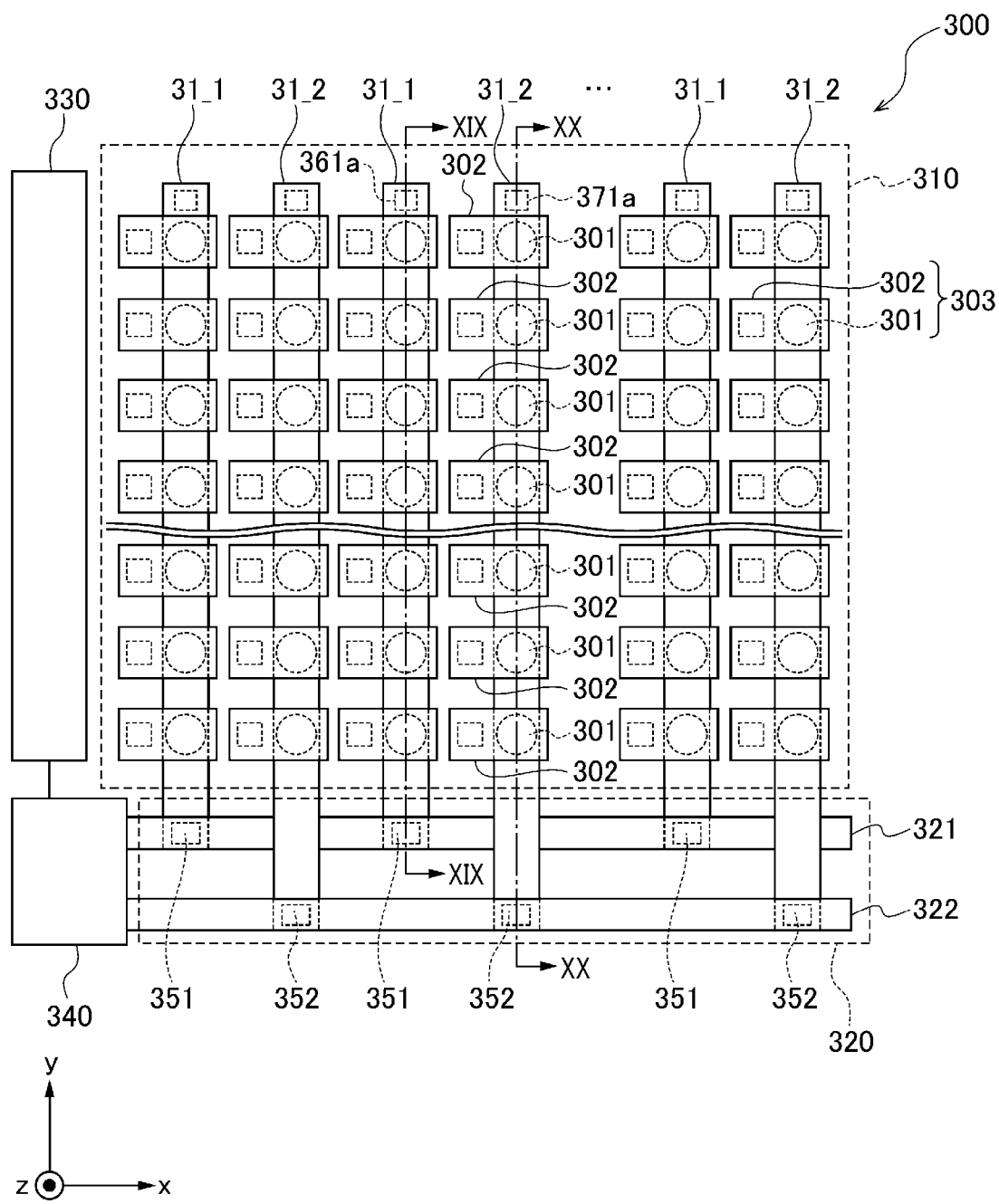
FIG. 18 is a schematic plan view of a magnetic memory device according to a third embodiment of the invention.

As shown in FIG. 18, in the memory cell array 310, a plurality of heavy metal layers (a plurality of lines) each having an elongate shape extending in one direction (y direction of FIG. 18) are arranged parallel to one another at predetermined intervals. The plurality of heavy metal layers include heavy metal layers 31_1 of odd columns and heavy metal layers 31_2 of even columns. A given number of memory cells 303 are disposed in series along a longitudinal direction (y direction of FIG. 18) of the heavy metal layer 31_1 on each of the heavy metal layers 31_1, and a given number of memory cells 303 are disposed in series along a longitudinal direction (y direction of FIG. 18) of the heavy metal layer 31_2 on each of the heavy metal layers 31_2. As described above, the plurality of memory cells 303 are arranged in a matrix along an extending direction (y direction) and an arrangement direction (x direction) of the plurality of heavy metal layers.

The memory cell 303 includes an MTJ element 301 as a magnetoresistive effect element, and an electrode 302 provided on the MTJ element 301. The MTJ element 301 includes a recording layer made of a ferromagnet, a barrier layer made of an insulator, and a reference layer made of a ferromagnet, and is an MTJ element having reversible magnetization by spin-orbit torque (SOT). The recording layer, the barrier layer, and the reference layer of the MTJ element 301 are stacked in this order, the recording layer is in contact with the heavy metal layer 31_1 or the heavy metal layer 31_2, and the reference layer is connected to the electrode 302.

The selection circuit 320 includes a first control line 321 and a second control line 322. The heavy metal layers 31_1 of the odd columns are connected to the first control line 321 through transistors 351, and the heavy metal layers 31_2 of the even columns are connected to the second control line 322 through transistors 352. The details of connection between these components will be described below (See FIG. 19 and FIG. 20).

The X decoder 330 is connected to a plurality of selection lines (not illustrated) for selecting a memory cell, and applies a voltage to the electrode 302 through the selection line that is an access target, under the control of the controller 340.

The controller 340 is connected to the X decoder 330, the first control line 321, and the second control line 322, and controls each of the X decoder 330, the first control line 321, and the second control line 322, in accordance with data writing or data reading.

In writing data, the controller 340 separately controls the first control line 321 and the second control line 322 such that a write current flows through the heavy metal layers 31_1 of the odd columns and the heavy metal layers 31_2 of the even columns at different points in time. Write control of the controller 340 will be described below.

Next, the connection between the heavy metal layer 31_1 and the first control line 321 and the connection between the heavy metal layer 31_2 and the second control line 322 will be described in detail with reference to FIG. 19 and FIG. 20.

Figure 19:
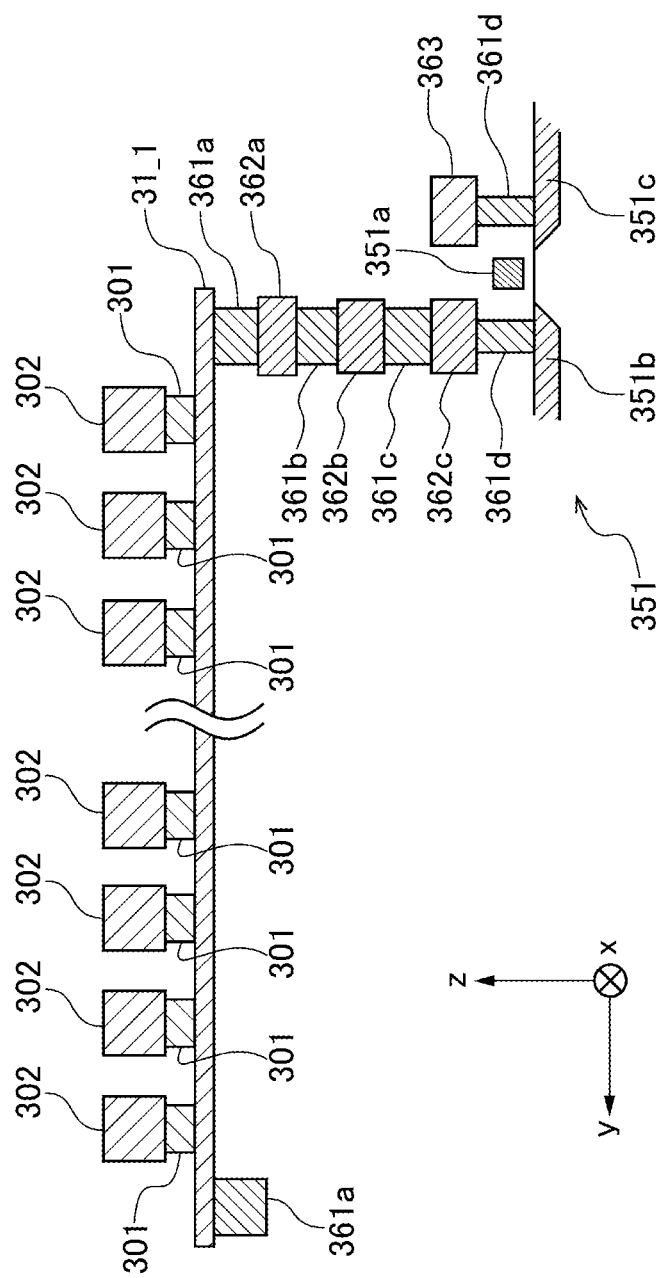
FIG. 19 is a sectional view of line XIX-XIX of FIG. 18.

FIG. 19 is a sectional view of line XIX-XIX of FIG. 18. The heavy metal layer 31_1 has one end connected to the ground via a through hole 361a, and the other end connected to the transistor 351. The transistor 351 is an electrical field effect transistor having a drain 351b connected to the heavy metal layer 31_1, and a source 351c connected to a power supply line 363. Specifically, the transistor 351 is provided at a lower layer than the heavy metal layer 31_1, and the heavy metal layer 31_1 is connected to the drain 351b of the transistor 351 via through holes 361a, 361b, 361c, and 361d and metal electrode layers 362a, 362b, and 362c provided in an interlayer insulating film. The power supply line 363 is connected to the source 351c of the transistor 351 via the through hole 361d. A gate 351a of the transistor 351 is connected to the first control line 321, and when a voltage is applied to the gate 351a, a current flows through the heavy metal layer 31_1.

Figure 20:
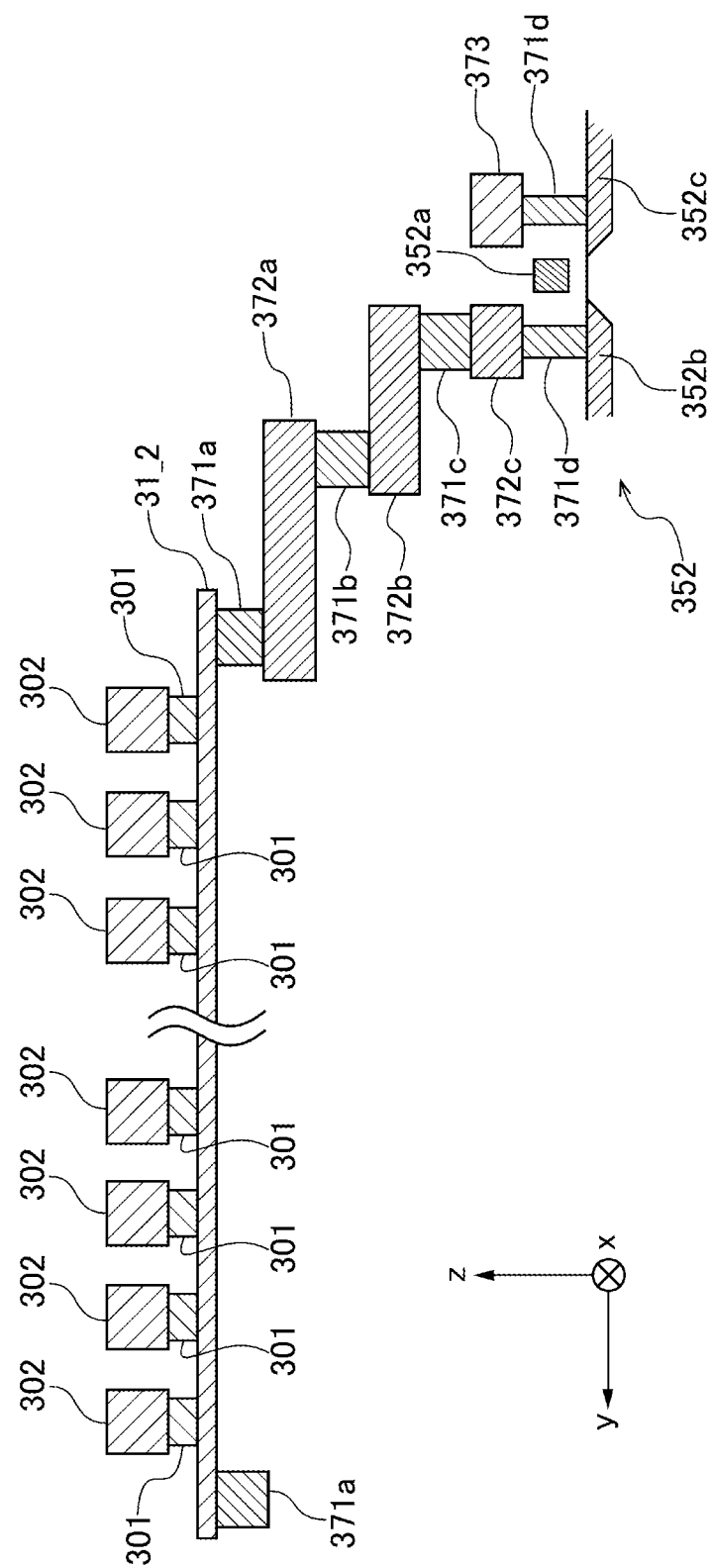
FIG. 20 is a sectional view of line XX-XX of FIG. 18.

FIG. 20 is a sectional view of line XX-XX of FIG. 18. The heavy metal layer 31_2 has one end connected to the ground via a through hole 371a, and the other end connected to the transistor 352. The transistor 352 is an electrical field effect transistor having a drain 352b connected to the heavy metal layer 31_2, and a source 352c connected to a power supply line 373. Specifically, the transistor 352 is provided at a lower layer than the heavy metal layer 31_2, and the heavy metal layer 31_2 is connected to the drain 352b of the transistor 352 via through holes 371a, 371b, 371c, and 371d and metal electrode layers 372a, 372b, and 372c provided in an interlayer insulating film. The power supply line 373 is connected to the source 352c of the transistor 352 via the through hole 371d. The gate 352a of the transistor 352 is connected to the second control line 322, and when a voltage is applied to the gate 352a, a current flows through the heavy metal layer 31_2.

As long as the first control line 321 and the second control line 322 are separately provided, it is possible to change a layout (FIG. 19) of the through holes and the metal electrode layers connecting between the heavy metal layer 31_1 and the transistor 351 and to change a layout (FIG. 20) of the through holes and the metal electrode layers connecting between the heavy metal layer 31_2 and the transistor 352.

Next, the write control of the controller 340 will be described. In an example below, the write current flows through the heavy metal layers 31_1 of the odd columns before the write current flows through the heavy metal layers 31_2 of the even columns, but the order may be reversed.

First, in accordance with data to be written, the controller 340 sets the potential of the power supply line 363, and causes the first control line 321 to turn ON the transistor 351 (that is, apply a voltage to the gate 351a), allowing the write current to flow through the heavy metal layer 31_1. Here, when the potential of the power supply line 363 is set to a lower level than the ground, the write current flows in −y direction of FIG. 18 and FIG. 19, and when the potential of the power supply line 363 is set to a higher level than the ground, the write current flows in a +y direction of FIG. 18 and FIG. 19. In addition, the controller 340 applies a voltage to the reference layer of the corresponding MTJ element 301 from the electrode 302 of the memory cell 303 that is a write target disposed on the heavy metal layer 31_1. Accordingly, magnetic anisotropy of the recording layer of the MTJ element 301 decreases, thereby writing data on the memory cell 303.

Next, the controller 340 turns OFF the transistor 351. And in accordance with data to be written, the controller 340 sets the potential of the power supply line 373, and causes the second control line 322 to turn ON the transistor 352 (that is, apply a voltage to the gate 352a), allowing the write current to flow through the heavy metal layer 31_2. Here, when the potential of the power supply line 373 is set to the lower level than the ground, the write current flows in -y direction of FIG. 18 and FIG. 20, and when the potential of the power supply line 373 is set to the higher level than the ground, the write current flows in +y direction of FIG. 18 and FIG. 20. In addition, the controller 340 applies a voltage to the reference layer of the corresponding MTJ element 301 from the electrode 302 of the memory cell 303 that is a write target disposed on the heavy metal layer 31_2. Accordingly, the magnetic anisotropy of the recording layer of the MTJ element 301 decreases, thereby writing data on the memory cell 303.

According to the magnetic memory device 300 of the third embodiment, it is possible to obtain almost the same effects as those of the magnetic memory device 100 of the first embodiment and the magnetic memory device 200 of the second embodiment. In particular, since the magnetic memory device 300 is capable of writing data collectively for each control line, it is possible to achieve higher-speed writing. In addition, a write current per one memory cell 303 can be decreased by writing data collectively, and the power consumption can be reduced.

In FIG. 18 to FIG. 20, the magnetic memory device 300 including two control lines is shown, but the number of control lines is not particularly limited as long as the number of control lines is two or more. As the write current increases, the influence of a stray magnetic field may not be disregard even when two control lines are separately controlled. Therefore, as shown in FIG. 21, the magnetic memory device may include three control lines, for example.

Figure 21:
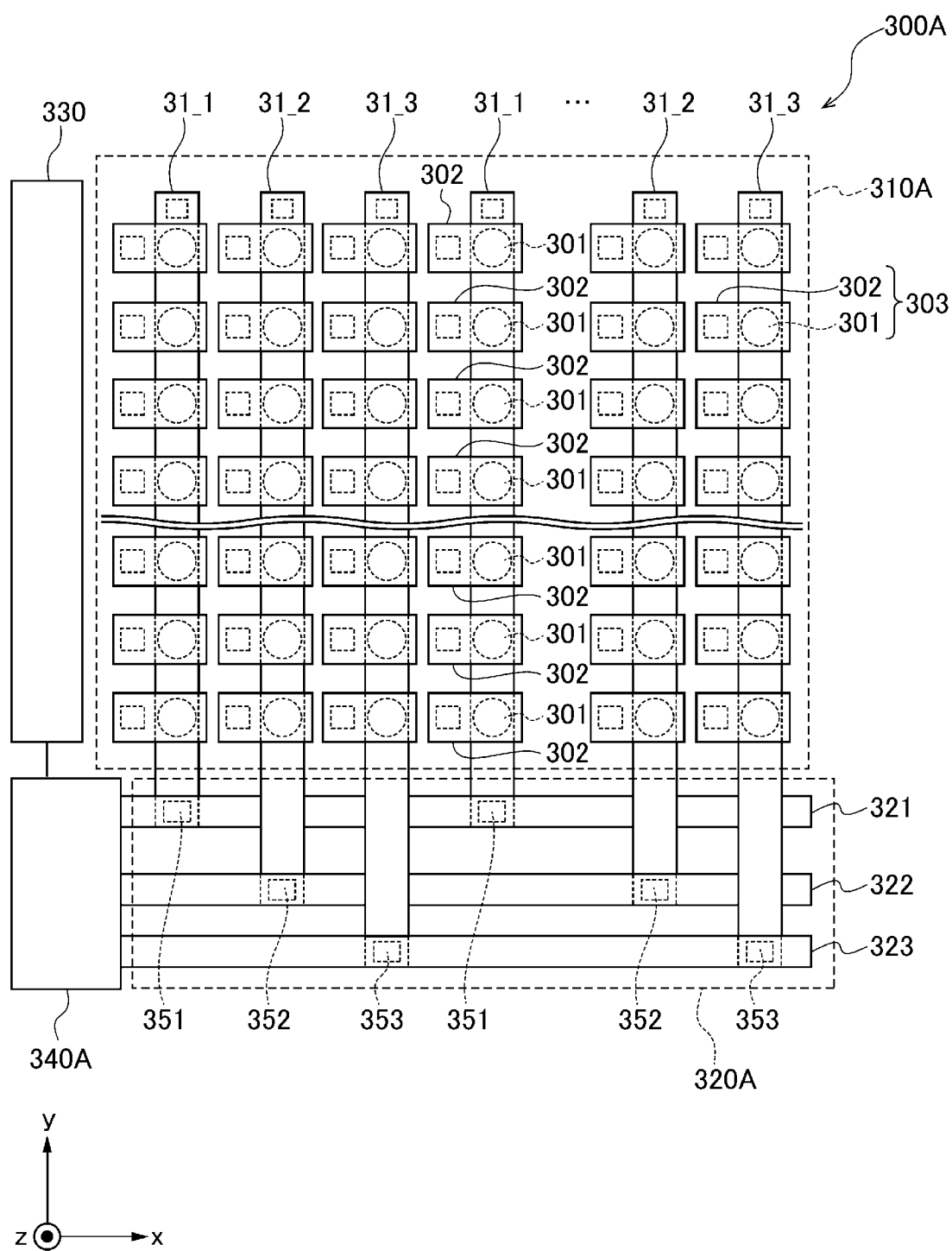
FIG. 21 is a schematic plan view of a magnetic memory device according to a modification example of the third embodiment.

A magnetic memory device 300A shown in FIG. 21 is an SOT-MRAM device, and includes a memory cell array 310A, a selection circuit 320A, an X decoder 330, and a controller 340A.

The selection circuit 320A includes the first control line 321, the second control line 322, and a third control line 323.

In the memory cell array 310A, the heavy metal layer 31_1 of the (3n-2)-th column (n is a positive integer) has one end connected to the ground, and the other end connected to the first control line 321 through the transistor 351. The heavy metal layer 31_2 of the (3n-1)-th column has one end connected to the ground, and the other end connected to the second control line 322 through the transistor 352. A heavy metal layer 31_3 of the 3n-th column has one end connected to the ground, and the other end connected to the third control line 323 through a transistor 353. Each of the transistors 351, 352, and 353 is an electrical field effect transistor.

The controller 340A is connected to the X decoder 330, the first control line 321, the second control line 322, and the third control line 323, and controls each of the X decoder 330, the first control line 321, the second control line 322, and the third control line 323, in accordance with data writing or data reading.

In writing data on the memory cell array 310A, the controller 340A separately controls the first control line 321, the second control line 322, and the third control line 323 such that the write current flows through the adjacent heavy metal layers at different points in time. For example, first, the transistor 351 connected to the first control line 321 is turned ON to allow the write current to flow through the heavy metal layer 31_1 of the (3n-2)-th column. Next, the transistor 351 is turned OFF, and the transistor 352 connected to the second control line 322 is turned ON to allow the write current to flow through the heavy metal layer 31_2 of the (3n-1)-th column. Next, the transistor 352 is turned OFF, and the transistor 353 connected to the third control line 323 is turned ON to allow the write current to flow through the heavy metal layer 31_3 of the 3n-th column.

According to the magnetic memory device 300A shown in FIG. 21, even when a larger write current flows, the occurrence of crosstalk can be suppressed.

Note that, in the magnetic memory device 300 and the magnetic memory device 300A of the third embodiment, one end of the heavy metal layer 31_1, one end of the heavy metal layer 31_2, and one end of the heavy metal layer 31_3 are connected to the ground, but such one end of each of the heavy metal layers may be set to a reference voltage other than the ground.

In the first to third embodiments, the selection circuit includes two or more control lines, and the adjacent lines of the plurality of lines are connected to different control lines, respectively. With this structure, the write current flows through predetermined non-adjacent lines simultaneously, and the write current flows through the adjacent lines at different points in time. In fourth to sixth embodiments described below, another circuit configuration for attaining such a writing operation will be described.

Fourth Embodiment

Figure 22:
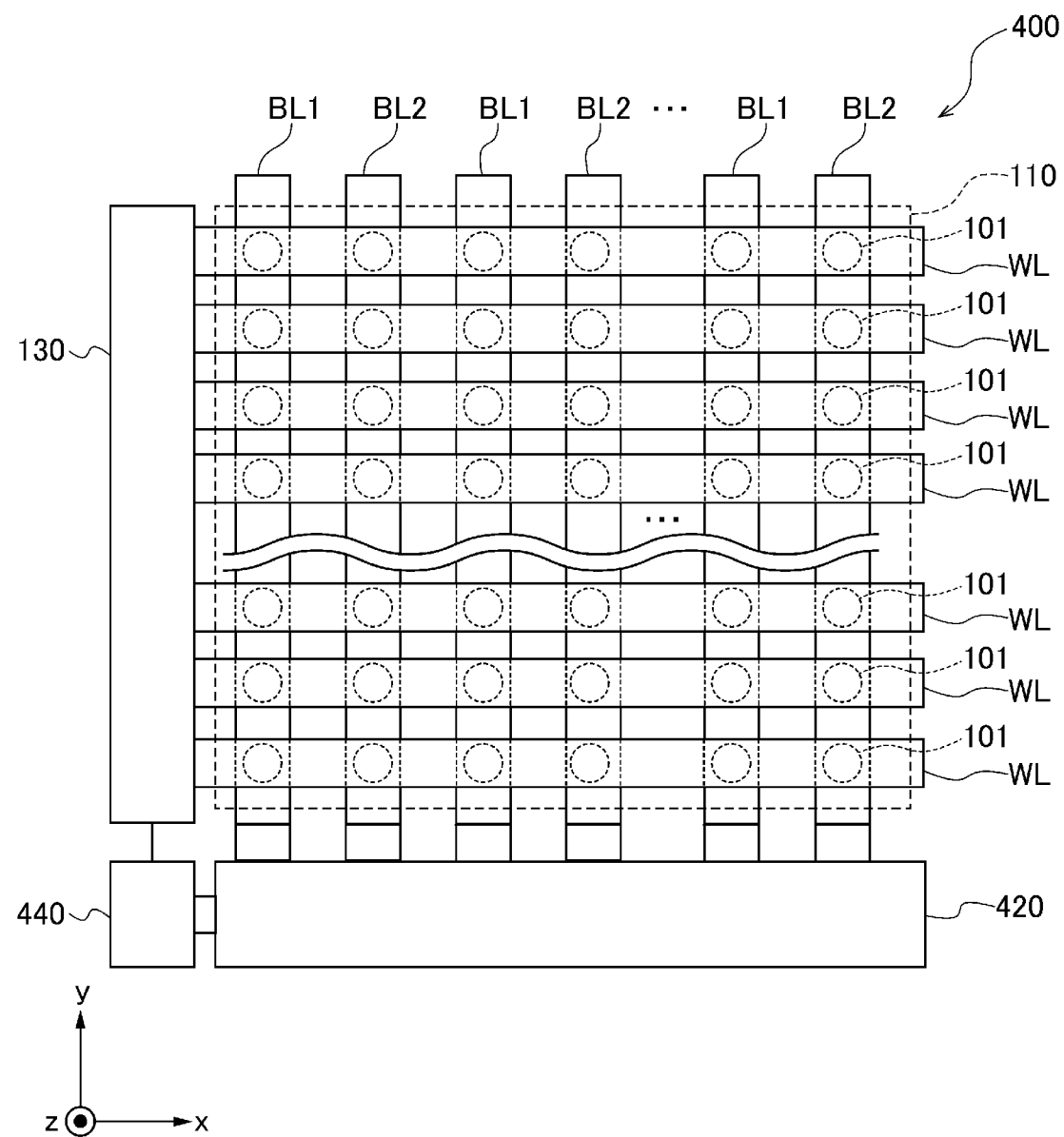
FIG. 22 is a schematic plan view of a magnetic memory device according to a fourth embodiment of the invention.

In FIG. 22, the configuration of a magnetic memory device 400 of a fourth embodiment is shown. The magnetic memory device 400 is an STT-MRAM device, and as shown in FIG. 22, includes the cross-point memory cell array 110, a selection circuit 420, the X decoder 130, and a controller 440. The magnetic memory device 400 of the fourth embodiment and the magnetic memory device 100 of the first embodiment are different in the configuration of the selection circuit and a write control method of the controller. Hereinafter, a difference from the magnetic memory device 100 of the first embodiment will be mainly described.

The controller 440 is connected to the selection circuit 420 and the X decoder 130. In writing data on the memory cell array 110, the controller 440 outputs address signals A0 and A1 for line selection to the selection circuit 420.

The selection circuit 420 selects non-adjacent lines (only odd bit lines BL1 or only even bit lines BL2) from a plurality of lines (the bit lines BL1 and BL2) to allow a write current to flow through the non-adjacent lines, in accordance with the address signals A0 and A1 output from the controller 440.

Figure 23:
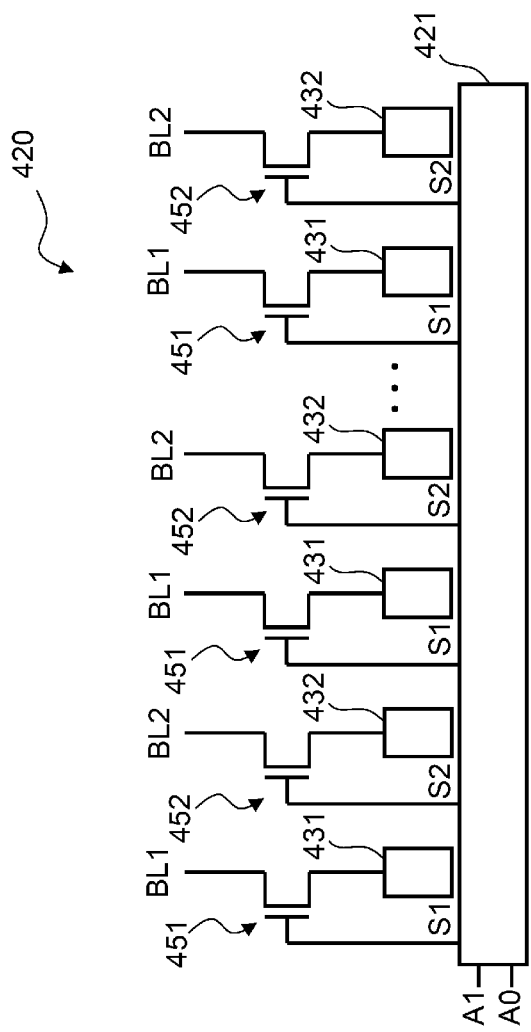
FIG. 23 is a schematic view illustrating a configuration of a selection circuit shown in FIG. 22.
Figure 24:
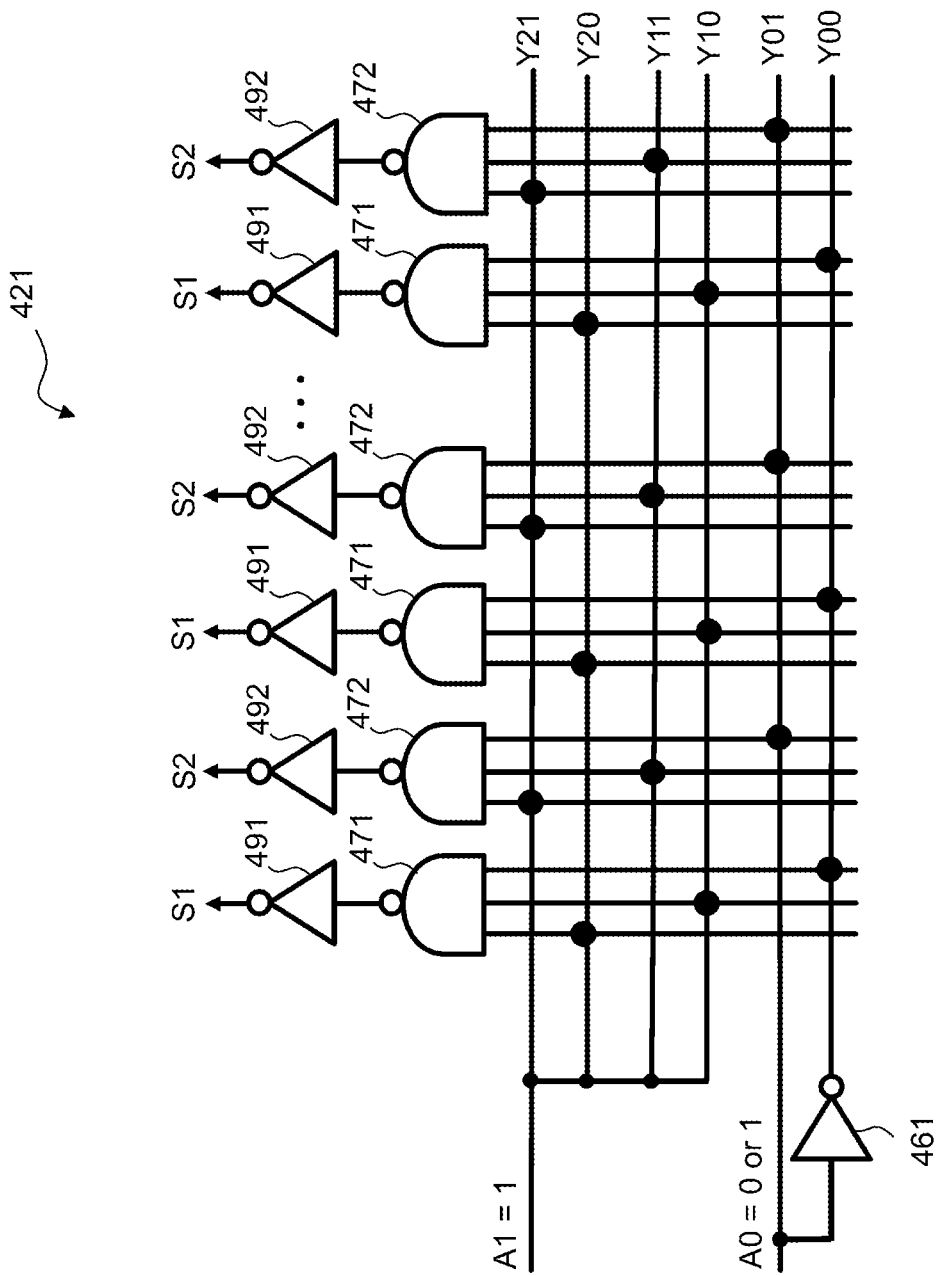
FIG. 24 is an example of a circuit configuration diagram of a Y decoder shown in FIG. 23.

In FIG. 23 and FIG. 24, the configuration of the selection circuit 420 is shown. As shown in FIG. 23, the selection circuit 420 includes a Y decoder 421, write drivers 431, transistors 451, write drivers 432, and transistors 452. The write drivers 431 and the transistors 451 are provided corresponding to the odd bit lines BL1, and the write drivers 432 and the transistors 452 are provided corresponding to the even bit lines BL2.

The transistor 451 is an electrical field effect transistor having a source connected to the bit line BL1, a drain connected to the write driver 431, and a gate connected to an output stage of a NOT gate 491 of the Y decoder 421 (FIG. 24). The transistor 452 is an electrical field effect transistor having a source connected to the bit line BL2, a drain connected to the write driver 432, and a gate connected to an output stage of a NOT gate 492 of the Y decoder 421 (FIG. 24).

The write driver 431 allows a current to flow through the transistor 451, under the control of the controller 440. The write driver 432 allows a current to flow through the transistor 452, under the control of the controller 440.

As shown in FIG. 24, the Y decoder 421 includes a NOT gate 461, six selection lines Y00, Y01, Y10, Y11, Y20, and Y21, NAND gates 471, the NOT gates 491, NAND gates 472, and the NOT gates 492. The NAND gates 471 and the NOT gates 491 are provided corresponding to the odd bit lines BL1, and the NAND gates 472 and the NOT gates 492 are provided corresponding to the even bit lines BL2.

An input stage of the NOT gate 461 and the selection line Y01 are connected to the controller 440. In writing data on the memory cell array 110, the address signal A0 is input into the NOT gate 461 and the selection line Y01 from the controller 440. An output stage of the NOT gate 461 is connected to the selection line Y00. An inverted signal of the address signal A0 is input into the selection line Y00 from the NOT gate 461. The address signal A0 is a High level ("1") or a Low level ("0").

Four selection lines Y10, Y11, Y20, and Y21 are connected to the controller 440. In writing data on the memory cell array 110, the address signal A1 is input into the four selection lines Y10, Y11, Y20, and Y21 from the controller 440. The address signal A1 that is output from the controller 440 is always the High level ("1").

Three selection lines Y00, Y10, and Y20 are connected to input stages of the NAND gates 471. Three other selection lines Y01, Y11, and Y21 are connected to input stages of the NAND gates 472. An output stage of the NAND gate 471 is connected to an input stage of the NOT gate 491. An output stage of the NAND gate 472 is connected to an input stage of the NOT gate 492.

An output stage of the NOT gate 491 is connected to the gate of the transistor 451, and an output stage of the NOT gate 492 is connected to the gate of the transistor 452.

Next, write control of the controller 440 will be described. In an example below, the write current flows through the odd bit lines BL1 before the write current flows through the even bit lines BL2, but the order may be reversed.

First, the controller 440 outputs the address signal A1 of the High level ("1") to four selection lines Y10, Y11, Y20, and Y21, and outputs the address signal A0 of the Low level ("0") to the NOT gate 461 and the selection line Y01. Accordingly, the address signal A0 is inverted at the NOT gate 461, and the selection line Y00 is in the High level ("1"). At this time, all of the three inputs of the NAND gate 471 are "1", and thus, "0" is output to the NOT gate 491 from the NAND gate 471, and an inverted signal "1" is output from the NOT gate 491, as a selection signal S1. On the other hand, the three inputs of the NAND gate 472 are "1", "1", and "0", and thus, "1" is output to the NOT gate 492 from the NAND gate 472, and an inverted signal "0" is output from the NOT gate 492, as a selection signal S2.

When the selection signal S1 of the High level ("1") is applied to the gate of each transistor 451, each transistor 451 is turned ON, and each write driver 431 allows the write current to collectively flow through the odd bit lines BL1. On the other hand, the selection signal S2 of the Low level ("0") is applied to the gate of each transistor 452, and thus, each transistor 452 is turned OFF, which does not allow the write current to flow through the even bit lines BL2.

Next, the controller 440 outputs the address signal A0 of the High level ("1") to the NOT gate 461 and the selection line Y01 while continuously maintaining the four selection lines Y10, Y11, Y20, and Y21 in the High level ("1"). Accordingly, the address signal A0 is inverted at the NOT gate 461, and the selection line Y00 is in the Low level ("0"). At this time, the three inputs of the NAND gate 471 are "1", "1", and "0", and thus, "1" is input to the NOT gate 491 from the NAND gate 471, and the inverted signal "0" is output from the NOT gate 491, as the selection signal S1. On the other hand, all of the three inputs of the NAND gate 472 are "1", and thus, "0" is output to the NOT gate 492 from the NAND gate 472, and the inverted signal "1" is output from the NOT gate 492, as the selection signal S2.

When the selection signal S2 of the High level ("1") is applied to the gate of each transistor 452, each transistor 452 is turned ON, and each write driver 432 allows the write current to collectively flow through the even bit lines BL2. On the other hand, when the selection signal S1 of the Low level ("0") is applied to the gate of each transistor 451, each transistor 451 is turned OFF, which does not allow the write current to flow through the odd bit lines BL1.

According to the magnetic memory device 400 of the fourth embodiment, it is possible to allow the write current to flow through the non-adjacent bit lines simultaneously while suppressing area overhead of the selection circuit 420, thereby obtaining the same effects as those of the magnetic memory device 100 of the first embodiment.

Fifth Embodiment

Figure 25:
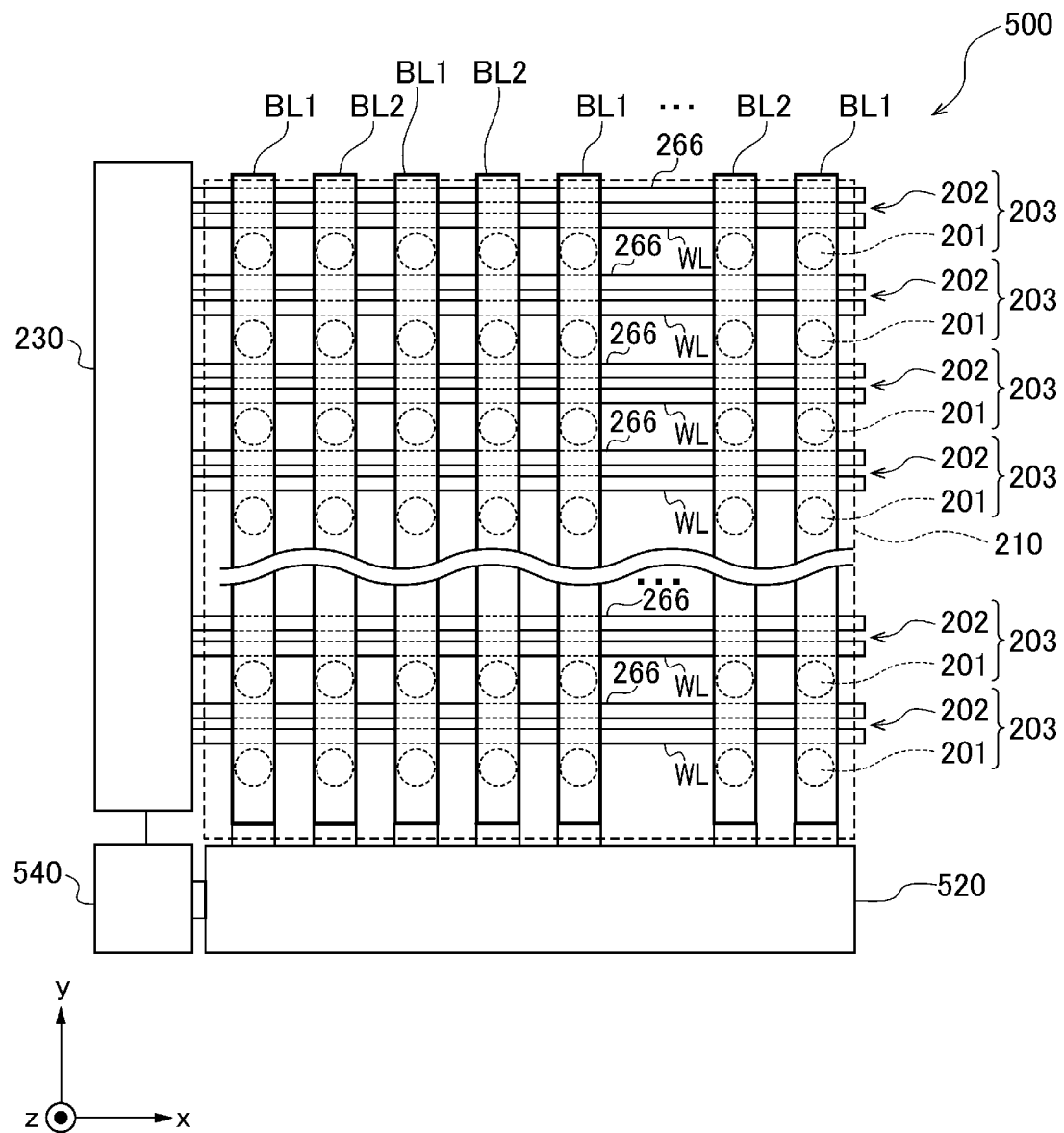
FIG. 25 is a schematic plan view of a magnetic memory device according to a fifth embodiment of the invention.

In FIG. 25, the configuration of a magnetic memory device 500 of a fifth embodiment is shown. The magnetic memory device 500 is a 1Tra-1MTJ type STT-MRAM device, and includes the memory cell array 210, a selection circuit 520, the X decoder 230, and a controller 540 as shown in FIG. 25.

The magnetic memory device 500 of the fifth embodiment and the magnetic memory device 200 of the second embodiment are different in the configuration of the selection circuit and the write control method of the controller. Hereinafter, a difference from the magnetic memory device 200 of the second embodiment will be mainly described.

The controller 540 is connected to the selection circuit 520 and the X decoder 230. In writing data on the memory cell array 210, the controller 540 outputs the address signals A0 and A1 for line selection to the selection circuit 520.

The selection circuit 520 selects non-adjacent lines (only odd bit lines BL1 or only even bit lines BL2) from a plurality of lines (the bit lines BL1 and BL2) to allow a write current to flow through the non-adjacent lines, in accordance with the address signals A0 and A1 output from the controller 540.

The configuration of the selection circuit 520 is identical to that of the selection circuit 420 of the fourth embodiment shown in FIG. 23 and FIG. 24. In addition, a write control method of the controller 540 is also identical to that of the controller 440 of the fourth embodiment.

According to the magnetic memory device 500 of the fifth embodiment, it is possible to allow the write current to flow through the non-adjacent bit lines simultaneously while suppressing area overhead of the selection circuit 520, thereby obtaining the same effects as those of the magnetic memory device 200 of the second embodiment.

Sixth Embodiment

Figure 26:
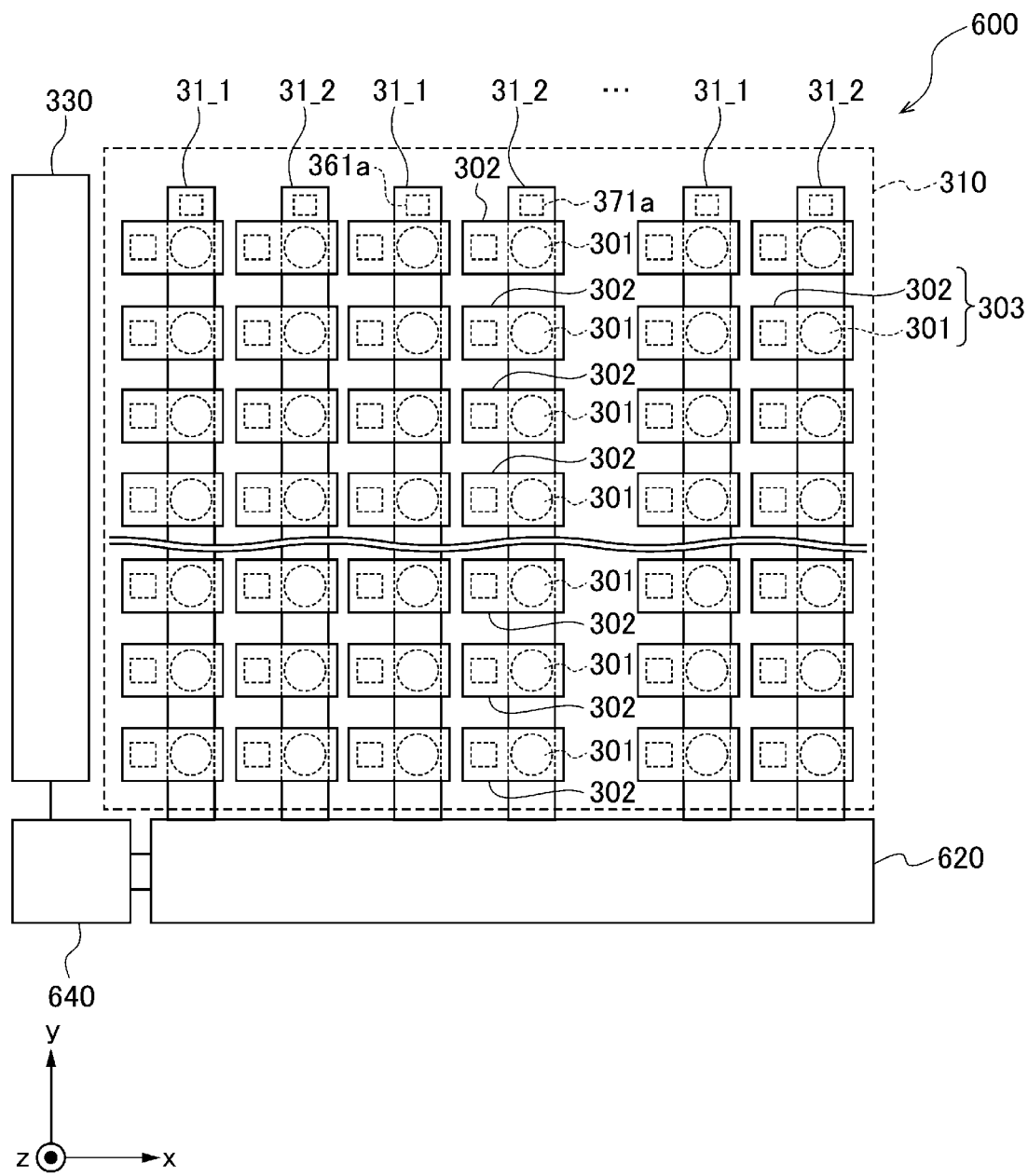
FIG. 26 is a schematic plan view of a magnetic memory device according to a sixth embodiment of the invention.

In FIG. 26, the configuration of a magnetic memory device 600 of a sixth embodiment is shown. The magnetic memory device 600 is an SOT-MRAM device, and includes the memory cell array 310, a selection circuit 620, the X decoder 330, and a controller 640 as shown in FIG. 26.

The magnetic memory device 600 of the sixth embodiment and the magnetic memory device 300 of the third embodiment are different in the configuration of the selection circuit and the write control method of the controller. Hereinafter, a difference from the magnetic memory device 300 of the third embodiment will be mainly described.

The controller 640 is connected to the selection circuit 620 and the X decoder 330. In writing data on the memory cell array 310, the controller 640 outputs the address signals A0 and A1 for line selection to the selection circuit 620.

The selection circuit 620 selects non-adjacent lines (only heavy metal layers 31_1 of odd columns or only heavy metal layers 31_2 of even columns) from a plurality of lines (the heavy metal layers 31_1 and 31_2) to allow a write current to flow through the non-adjacent lines, in accordance with the address signals A0 and A1 output from the controller 640.

The configuration of the selection circuit 620 is also identical to that of the selection circuit 420 of the fourth embodiment shown in FIG. 23 and FIG. 24. In the selection circuit 620, the source of the transistor 451 is connected to the heavy metal layer 31_1, and the source of the transistor 452 is connected to the heavy metal layer 31_2. In addition, a write control method of the controller 640 is also identical to that of the controller 440 of the fourth embodiment.

According to the magnetic memory device 600 of the sixth embodiment, it is possible to allow the write current to flow through the non-adjacent heavy metal layers simultaneously while suppressing area overhead of the selection circuit 620, thereby obtaining the same effects as those of the magnetic memory device 300 of the third embodiment.

REFERENCE SIGNS LIST 100, 100A, 200, 200A, 200B, 300, 300A, 400, 500, 600 Magnetic memory device
101, 203, 303 Memory cell
110, 110A, 210, 210A, 210B, 310, 310A Memory cell array
120, 120A, 220, 220A, 220B, 320, 320A, 420, 520, 620 Selection circuit
121, 221, 321 First control line
122, 222, 322 Second control line
123, 223, 323 Third control line
130, 230, 230B, 330 X decoder
140, 140A, 240, 240A, 240B, 340, 340A, 440, 540, 640 Controller
151, 152, 153, 251, 252, 253, 351, 352, 353 Transistor
151a, 152a, 251a, 252a, 351a, 352a Gate
151b, 152b, 251b, 252b, 351b, 352b Drain
151c, 152c, 251c, 252c, 351c, 352c Source
201, 301 MTJ element
202 Selection transistor
202a Gate
202b Drain
202c Source
266, 276 Source line
302 Electrode
31_1, 31_2, 31_3 Heavy metal layer
421 Y decoder
431, 432 Write driver
451, 452 Transistor
461, 491, 492 NOT gate
471, 472 NAND gate
A0, A1 Address signal
BL1, BL2, BL3 Bit line
WL Word line
Iw Write current
S1, S2 Selection signal

The invention claimed is:

1. A magnetic memory device comprising:
   a memory cell array including:
      a plurality of lines arranged parallel to one another at predetermined intervals and extending in one direction;
      a plurality of word lines intersecting with the plurality of lines and arranged parallel to one another at predetermined intervals; and
      a plurality of memory cells connected to the plurality of lines and the plurality of word lines and arranged in a matrix along an extending direction of the plurality of lines and along an arrangement direction of the plurality of lines, each of the plurality of memory cells including a magnetoresistance effect element;
   a selection circuit connected to the plurality of lines and configured to select non-adjacent lines that are not adjacent to one another, from the plurality of lines;
   an X decoder connected to the plurality of word lines; and
   a controller connected to the selection circuit and the X decoder, wherein the controller is configured to cause the selection circuit to select the non-adjacent lines and allow a write current to flow through the non-adjacent lines simultaneously and control the X decoder to simultaneously apply selection voltages to word lines on different rows in which selected memory cells are included from the plurality of word lines in writing data on the memory cell array.

2. The magnetic memory device according to claim 1, wherein the selection circuit includes two or more control lines,
   adjacent lines of the plurality of lines are respectively connected to different control lines of the two or more control lines, and
   in writing data on the memory cell array, the controller is configured to separately control the two or more control lines and allow the write current to flow through the adjacent lines of the plurality of lines at different points in time.

3. The magnetic memory device according to claim 2, wherein the selection circuit includes a plurality of transistors respectively connected to the plurality of lines,
   adjacent transistors of the plurality of transistors are respectively connected to the adjacent lines of the plurality of lines, and are respectively connected to the different control lines of the two or more control lines, and
   the controller is configured to control ON and OFF of the plurality of transistors for each of the two or more control lines.

4. The magnetic memory device according to claim 1, wherein
   the selection circuit includes a Y decoder and write drivers provided corresponding to the plurality of lines,
   in writing data on the memory cell array, the controller is configured to output an address signal for line selection to the selection circuit to input the address signal into a Y decoder, and
   the selection circuit is configured to select the non-adjacent lines from the plurality of lines to allow the write current to flow through the non-adjacent lines, in accordance with the address signal output from the controller.

5. The magnetic memory device according to claim 1, wherein the magnetoresistance effect element is a magnetic tunnel junction element having reversible magnetization by spin transfer torque.

6. The magnetic memory device according to claim 1, wherein the memory cell array includes:
   a plurality of bit lines as the plurality of lines; and
   a plurality of word lines intersecting with the plurality of bit lines and arranged parallel to one another at predetermined intervals, and
   the memory cell array is a cross-point memory cell array in which the plurality of memory cells are located at intersection points between the plurality of bit lines and the plurality of word lines.

7. The magnetic memory device according to claim 1, wherein each of the plurality of memory cells includes:
   a magnetic tunnel junction element that is defined as the magnetoresistance effect element and has reversible magnetization by spin transfer torque; and a selection transistor connected to the magnetic tunnel junction element to select the magnetic tunnel junction element as a selected memory cell target, wherein a drain of the selection transistor is connected to the magnetic tunnel junction element, a source of the selection transistor is connected to a source line, a gate of the selection transistor is connected to a word line of the plurality of word lines, and the source line and the word line extend along the arrangement direction of the plurality of lines.

8. The magnetic memory device according to claim 1, wherein the magnetoresistance effect element is a magnetic tunnel junction element having reversible magnetization by spin-orbit torque.

9. The magnetic memory device according to claim 1, wherein the memory cell array includes a plurality of heavy metal layers as the plurality of lines, the plurality of memory cells include a plurality of magnetic tunnel junction elements, respectively, each of the plurality of magnetic tunnel junction elements being defined as the magnetoresistance effect element and having reversible magnetization by spin-orbit torque, and the plurality of magnetic tunnel junction elements are disposed on the plurality of heavy metal layers.

10. The magnetic memory device according to claim 7, wherein the selection transistor and another selection transistor adjacent to one another in the extending direction of the plurality of lines share the source line.

* * * * *